(12) United States Patent
Shirai et al.

(10) Patent No.: US 7,001,197 B2
(45) Date of Patent: Feb. 21, 2006

(54) LAND GRID ARRAY SOCKET

(75) Inventors: Hiroshi Shirai, Tokorozawa (JP);
Masashi Inoue, Yokohama (JP);
Shinichi Hashimoto, Kawasaki (JP)

(73) Assignee: Tyco Electronics AMP K.K., Kanagawa (JP)

( * ) Notice: Subject to any disclaimer, the term of this patent is extended or adjusted under 35 U.S.C. 154(b) by 0 days.

(21) Appl. No.: 10/696,834

(22) Filed: Oct. 30, 2003

(65) Prior Publication Data

US 2004/0095693 A1 May 20, 2004

(30) Foreign Application Priority Data

Oct. 31, 2002 (JP) .................................. 2002-317646
Dec. 27, 2002 (JP) .................................. 2002-379635

(51) Int. Cl.
*H01R 13/62* (2006.01)

(52) U.S. Cl. ...................................................... 439/331
(58) Field of Classification Search ................. 439/331, 439/68, 70–73, 330, 525–526
See application file for complete search history.

(56) References Cited

U.S. PATENT DOCUMENTS

| 5,074,798 A | * | 12/1991 | Carter ........................... 439/72 |
| 5,310,350 A | | 5/1994 | Matsuoka et al. |
| 5,387,120 A | * | 2/1995 | Marks et al. ................ 439/331 |
| 5,688,140 A | | 11/1997 | McHugh et al. ............ 439/342 |
| 6,086,387 A | | 7/2000 | Gallagher et al. ............. 439/71 |
| 6,191,480 B1 | | 2/2001 | Kastberg et al. |
| 6,449,157 B1 | | 9/2002 | Chu |
| 6,648,656 B1 | * | 11/2003 | Ma .............................. 439/73 |
| 2004/0032720 A1 | * | 2/2004 | McHugh et al. ............ 361/719 |

FOREIGN PATENT DOCUMENTS

| EP | 1 006 618 A2 | 6/2000 |
| JP | 2-86090 | 7/1990 |
| JP | 2000-173735 | 6/2000 |

OTHER PUBLICATIONS

European Search Report; Application No. EP 03 25 6527; dated Jan. 5, 2005.

* cited by examiner

*Primary Examiner*—J. F. Duverne
(74) *Attorney, Agent, or Firm*—Barley Snyder LLC

(57) ABSTRACT

A land grid array socket comprises an insulative housing having a plurality of contacts. The insulative housing has a top surface for receiving a land grid array package. A cover member is pivotally mounted on a first end of the insulative housing. The cover member is pivotal between an open position and a closed position where the cover member presses the land grid array package toward the top surface of the insulative housing so that the land grid array package electrically connects to the contacts. A lever is pivotally mounted on a second end of the insulative housing. The lever has a locking portion for locking the cover member in the closed position. A metallic reinforcing plate is positioned on a bottom surface of the housing. The metallic reinforcing plate extends between the first end and the second end of the insulative housing.

53 Claims, 22 Drawing Sheets

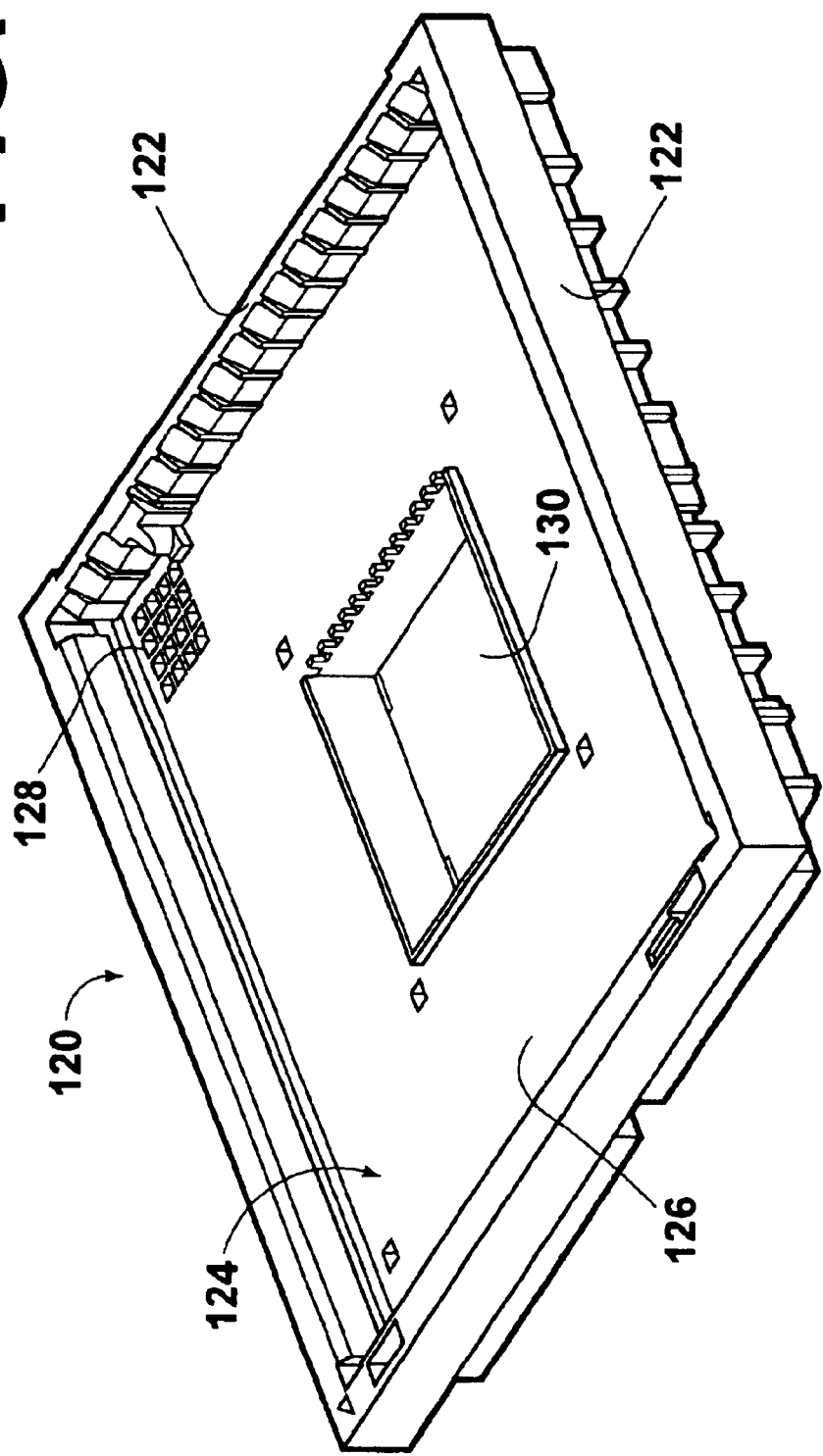

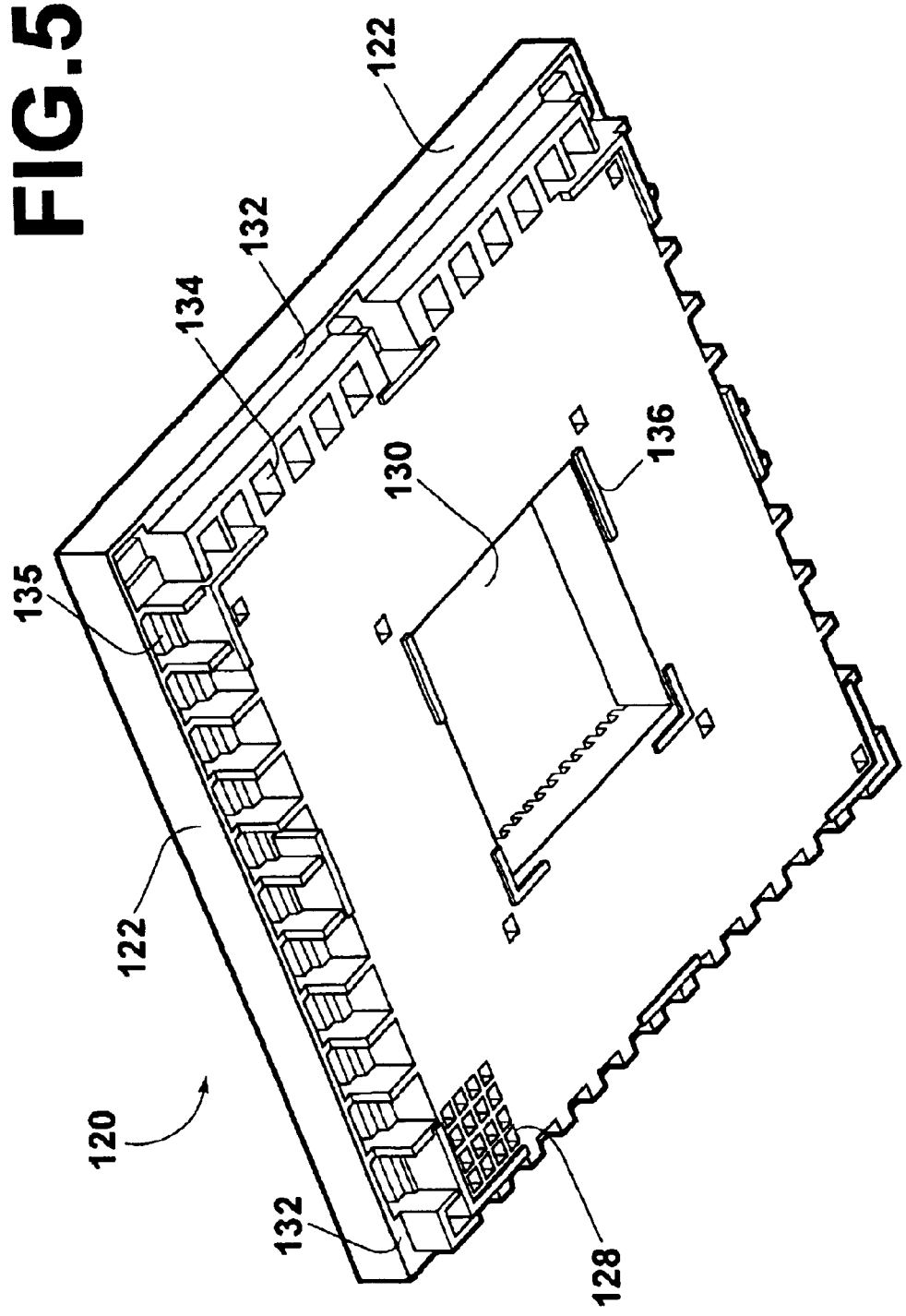

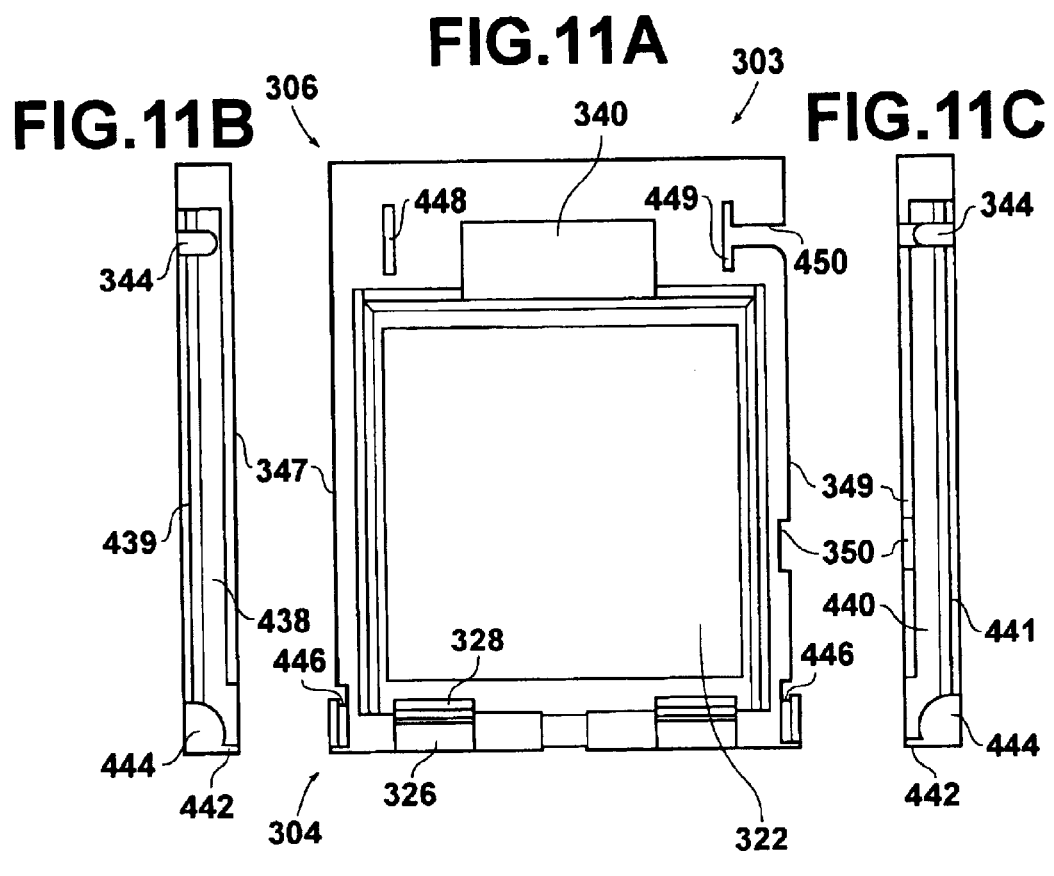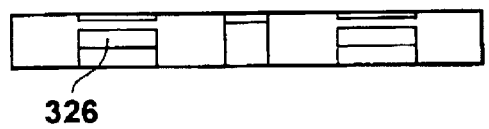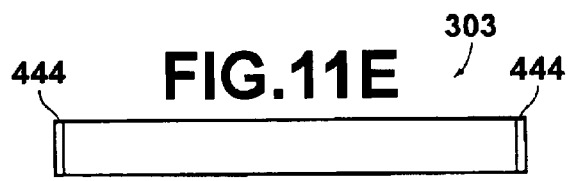

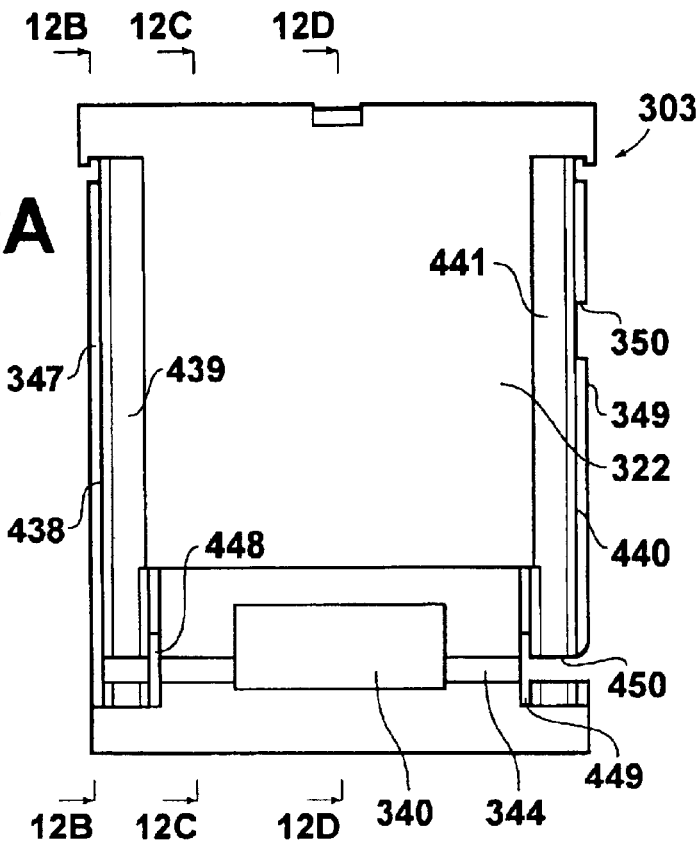
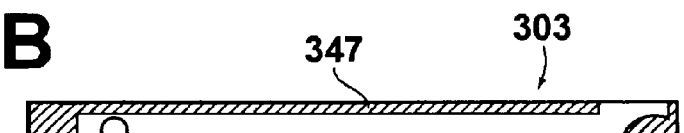
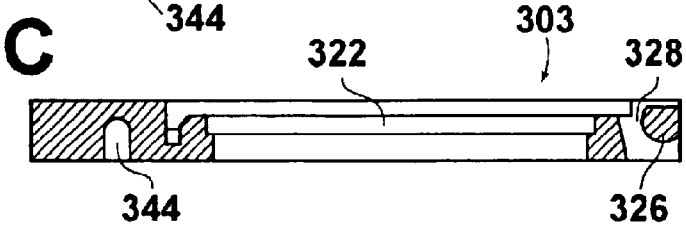
FIG.12A
FIG.12B
FIG.12C
FIG.12D

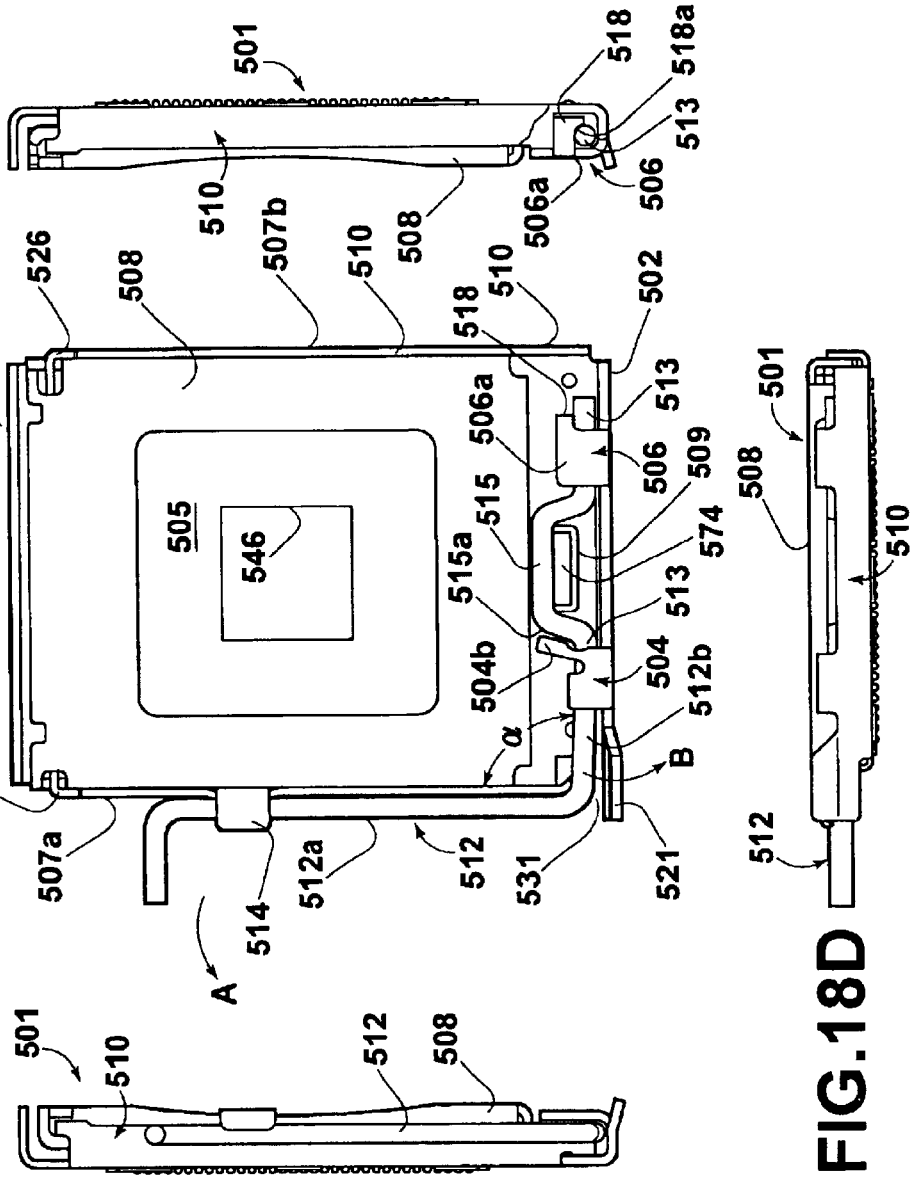

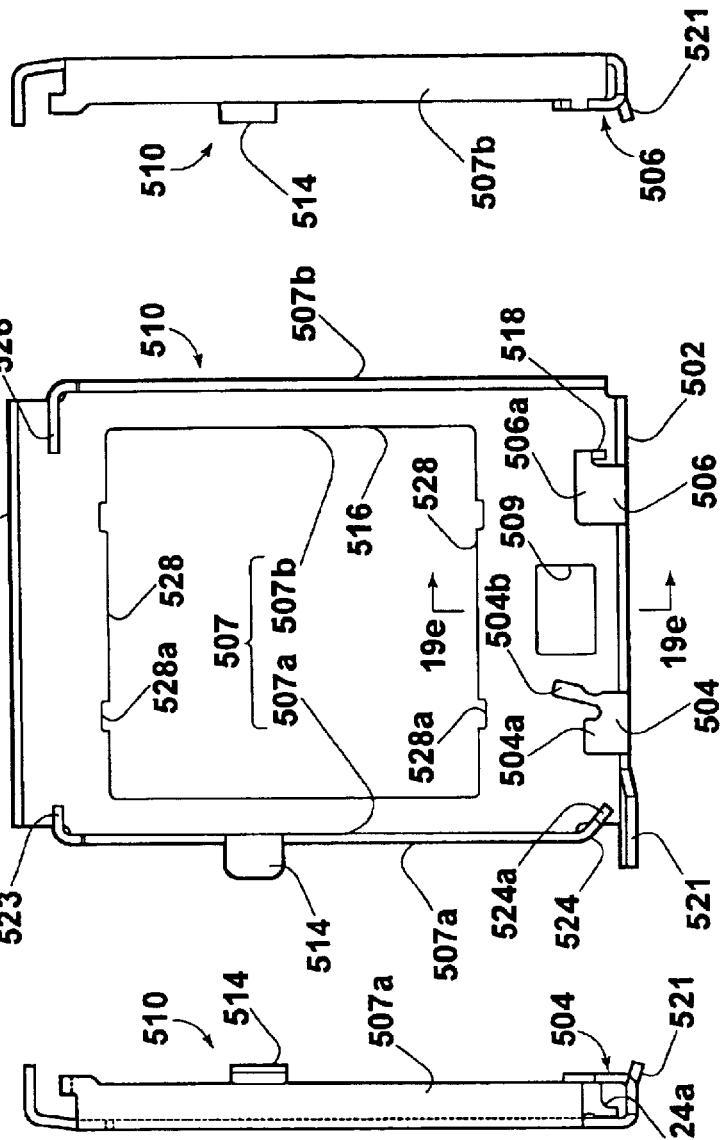

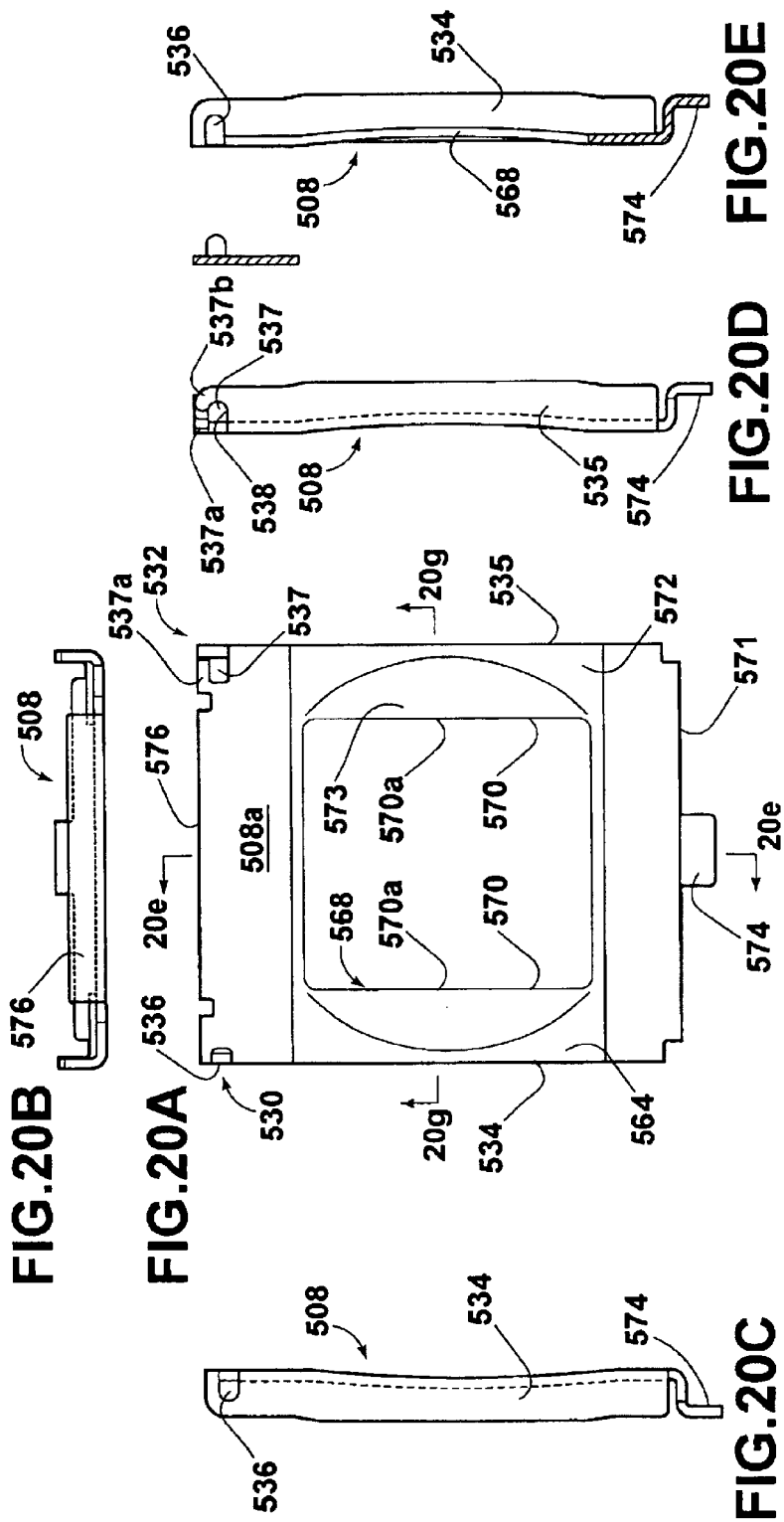

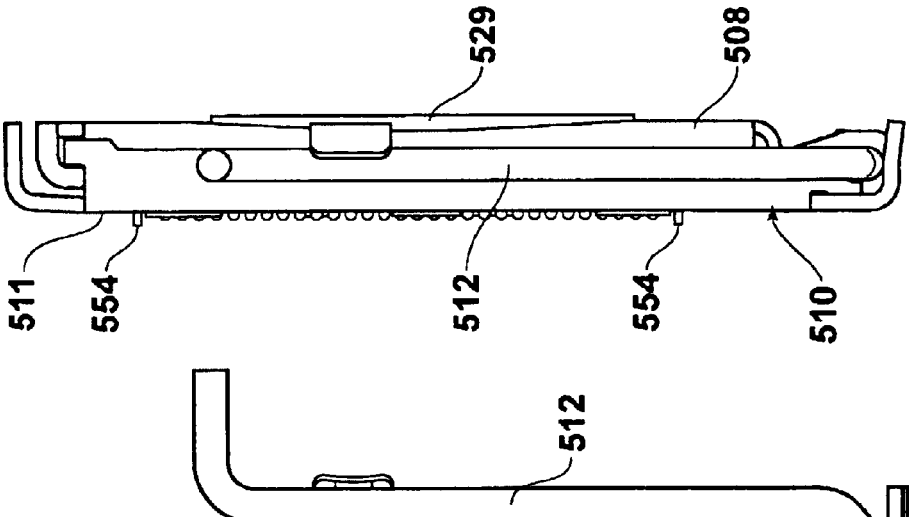
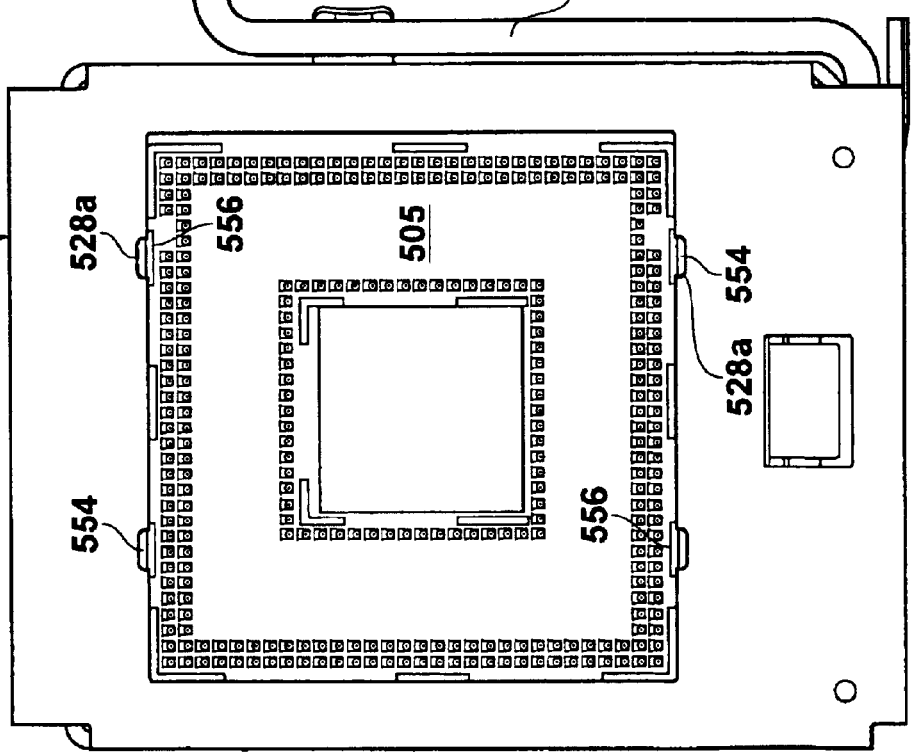

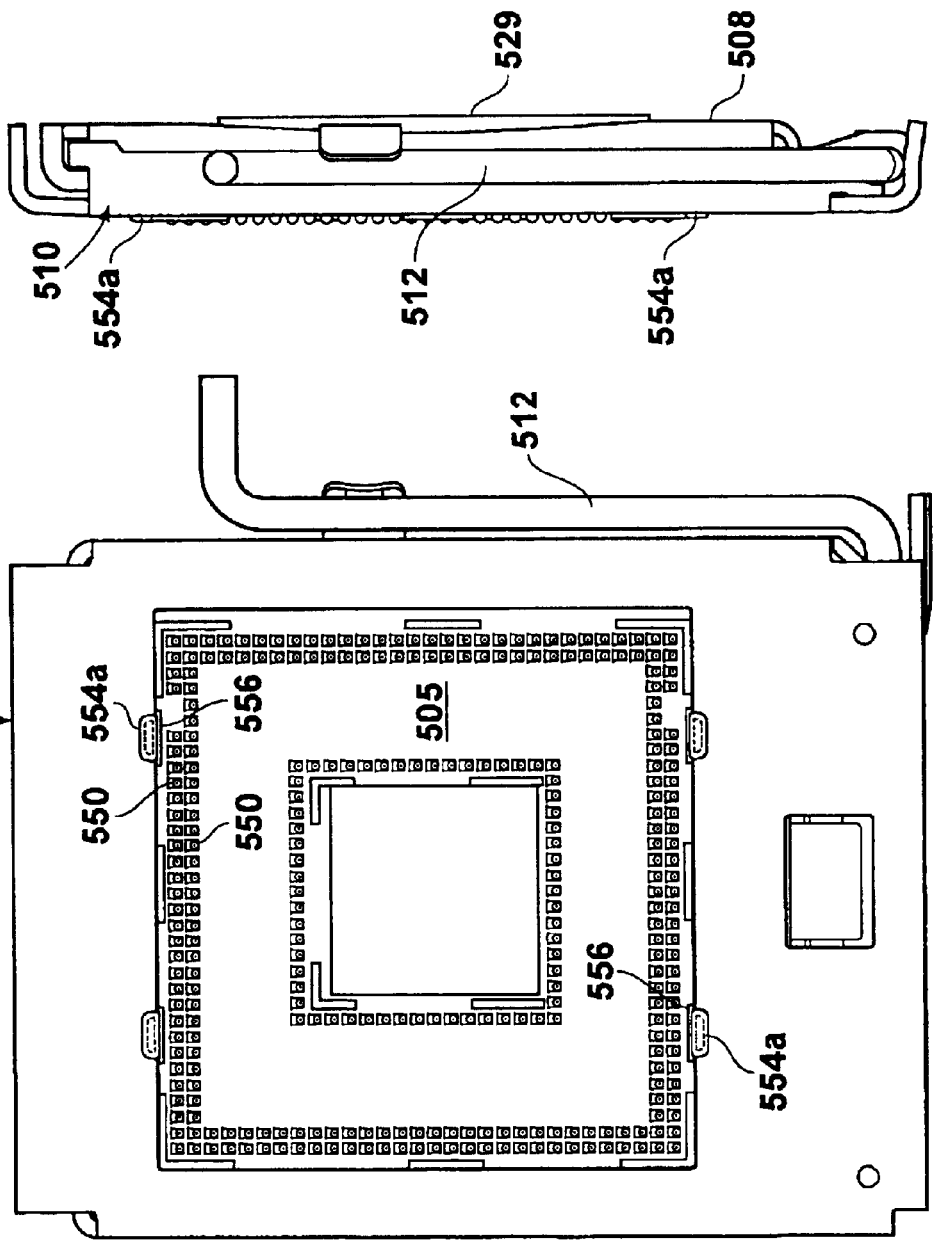

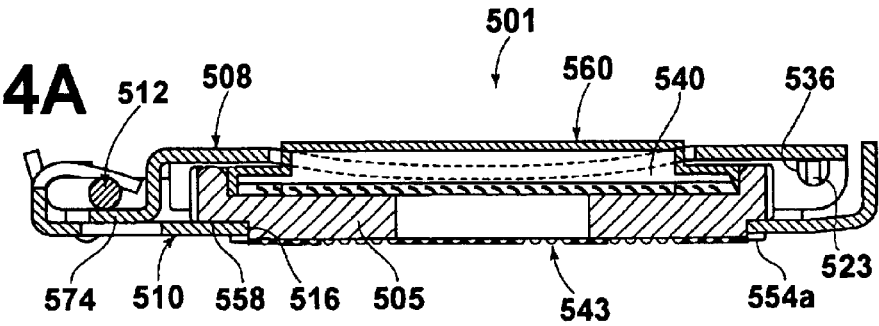
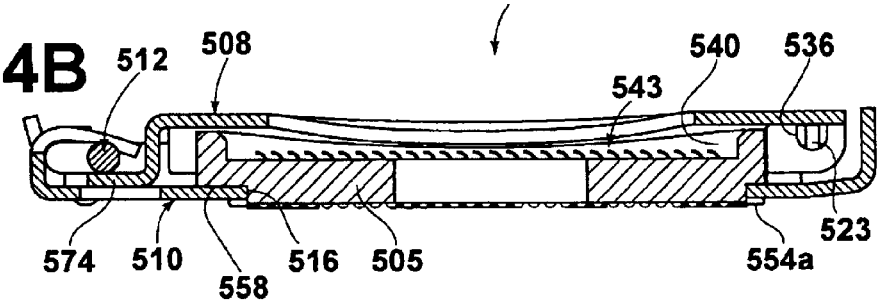
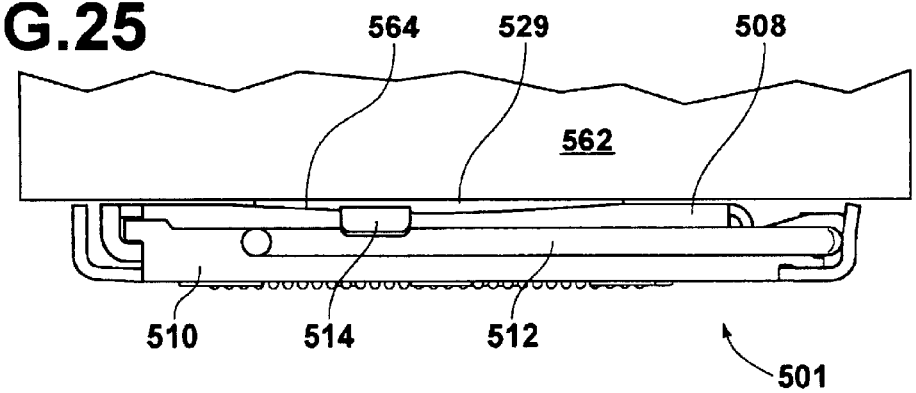
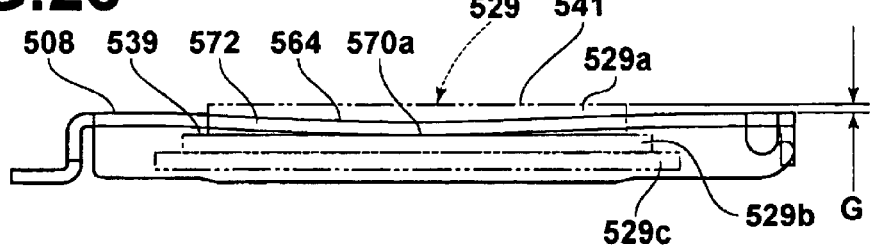

LAND GRID ARRAY SOCKET

FIELD OF THE INVENTION

The invention relates to a land grid array (LGA) socket having an insulative housing with contacts that are electrically connected under pressure with corresponding contacts in a LGA package accommodated in the insulative housing to form an electrical connection between the LGA package and a printed circuit board.

BACKGROUND OF THE INVENTION

Various types of conventional integrated circuit (IC) sockets for attaching IC packages are known. Each of the IC packages has a large number of contacts that are arranged in a matrix-like array. The IC packages are classified as pin grid array (PGA) packages, ball grid array (BGA) packages, or land grid array (LGA) packages depending on the shape of an electric contact portion of the contacts. The contacts in each of the IC packages are brought into contact with corresponding contacts arranged in a housing of the socket to establish electrical connections therebetween. The mating of the contacts in the IC package with the corresponding contacts in the socket typically causes a large contact pressure to be exerted on the socket. In cases where a large contact pressure is exerted on the socket, various methods are known to provide the socket with sufficient strength to prevent deformation of the socket. Different methods are used to prevent deformation of the socket depending on the direction of the force that is exerted on the socket.

For example, FIGS. 1 and 2 of Japanese Unexamined Patent Publication No. 2000-173735 teach a PGA socket with an insulative housing having peripheral edges reinforced by over-molding a thin metallic frame member with an insulating resin from which the housing was formed. A slide cover with a PGA package thereon is moved in a horizontal direction by a cam or a lever so that electrical connections between the socket and the PGA package are formed. Because the housing is not subjected to a large vertical force, the underside of the housing is not reinforced. Although this socket is suitable for use with PGA packages, this socket lacks sufficient strength for use with LGA packages wherein the LGA package is pressed from above the socket and a large vertical force is exerted on the socket in a direction substantially perpendicular to a printed circuit board.

To prevent deformation of a housing of a LGA socket when a large force is exerted in a vertical direction, a pair of metal reinforcements is provided. The metal reinforcements clamp the LGA package and the socket fitted with the LGA package together from opposite sides (from both front and back surface sides) of a printed circuit board to which the socket is fitted. The metal reinforcements include a loading plate or heat sink disposed on the LGA package and a board restraint plate disposed under a mount board. A screw is passed through the loading plate or heat sink and the board restraint plate at each corner thereof and is tightened by a nut to prevent deformation of the socket. The printed circuit board has apertures on a periphery thereof for accommodating the screws. This configuration, however, requires a larger footprint on the printed circuit board than that actually occupied by the socket itself. Thus, the socket size is large, a large number of parts, such as, screws, are required, and assembly is complicated. In another embodiment, the LGA package and the socket are disposed between a heat sink and a printed circuit board, and the socket is directly screwed to the printed circuit board. In this configuration, however, the printed circuit board is susceptible to warping.

Additionally, as taught in FIGS. 1 and 3 of Japanese Unexamined Utility Model Publication No. 2-86090, a lever may be used to connect and maintain electrical connections between contacts of an IC package and corresponding contacts of a socket. The lever may be adapted to be engaged with a protrusion or elastic interlocking element integrally formed with a resin housing of the socket. The lever may be locked by the protrusion or elastic interlocking element to hold the electrical connections between the contacts. Since the protrusion or the elastic interlocking element is made of resin, the protrusion or the elastic interlocking element is apt to wear-out due to friction with the lever during operation of the lever. The socket, therefore, is not durable. Forming the protrusion or the interlocking element as a separate metal member, however, increases the number of parts and the manufacturing costs.

Further, if the housing of the socket deforms when the LGA package is pressed by a cover member to form electrical connections between the contacts, the electrical contact array may become warped and deteriorate the electrical connections between the contacts. A force applied to the lever for actuation will also not efficiently be transferred, because the force will be absorbed by the deformation of the housing.

SUMMARY OF THE INVENTION

It is, therefore, an object of the invention to provide a LGA socket that has sufficient strength so that deformation of a housing of the socket is prevented when the socket is fitted to a LGA package wherein the socket has a simple construction for ease of installation. It is another object of the invention is to provide a LGA socket in which sufficient strength is ensured without increasing the size of a footprint of the socket. It is still another object of the invention to provide a durable LGA socket.

This and other objects are achieved by a land grid array socket comprising an insulative housing having a plurality of contacts. The insulative housing has a top surface for receiving a land grid array package. A cover member is pivotally mounted on a first end of the insulative housing. The cover member is pivotal between an open position and a closed position where the cover member presses the land grid array package toward the top surface of the insulative housing so that the land grid array package electrically connects to the contacts. A lever is pivotally mounted on a second end of the insulative housing. The lever has a locking portion for locking the cover member in the closed position. A metallic reinforcing plate is positioned on a bottom surface of the housing. The metallic reinforcing plate extends between the first end and the second end of the insulative housing.

This and other objects are further achieved by a land grid array socket comprising an insulative housing having a plurality of contacts and a top surface for receiving a land grid array package that electrically connects to the contacts. A metallic reinforcing plate is positioned on a bottom surface of the housing. The metallic reinforcing plate extends between a first end and a second end of the insulative housing. A lever is pivotally mounted on the metallic reinforcing plate. The lever has a locking portion for locking the cover member against the insulative housing. A cover member is pivotally mounted on the insulative housing. The cover member is pivotally supported by the metallic reinforcing plate.

3

BRIEF DESCRIPTION OF THE DRAWINGS

FIG. 3 shows an outer housing of the LGA socket of FIG. 1.

FIG. 4 is a top perspective view of an inner housing of the LGA socket of FIG. 1.

FIG. 5 is a bottom perspective view of the inner housing of FIG. 4.

FIG. 6 shows a cover member of the LGA socket of FIG. 1.

FIG. 11 shows an outer housing of a LGA socket according to a second embodiment of the invention; FIG. 11A is a plan view; FIG. 11B is a left side view; FIG. 11C is a right side view; FIG. 11D is a front view; and FIG. 11E is a rear view.

FIG. 12 shows the outer housing of FIG. 11; FIG. 12A is a bottom view; FIG. 12B is a sectional view taken along line 12B—12B of FIG. 12A; FIG. 12C is a sectional view taken along line 12C—12C of FIG. 12A; and FIG. 12D is a sectional view taken along line 12D—12D of FIG. 12A.

FIG. 13 shows a first reinforcing plate of the LGA socket of FIG. 11.

FIG. 14 shows a second reinforcing plate of the LGA socket of FIG. 11.

FIG. 15 shows the LGA socket of FIG. 11.

FIG. 18 shows a LGA socket according to a third embodiment of the invention; FIG. 18A is a first side view; FIG. 18B is a plan view; FIG. 18C is a partially broken away second side view; and FIG. 18D is a front view.

FIG. 19 shows a metallic reinforcing plate of the LGA socket of FIG. 18; FIG. 19A is a plan view; FIG. 19B is a first side view; FIG. 19C is a second side view; FIG. 19D is a partial sectional view taken along line 19e—19e of FIG. 19A; FIG. 19E is side view of a supporting tongue element.

FIG. 20 shows a cover member of the LGA socket of FIG. 18; FIG. 20A is a plan view; FIG. 20B is a rear view; FIG. 20C is a first side view; FIG. 20D is a second side view; FIG.

4

20E is a sectional view taken along line 20e—20e of FIG. 20A; FIG. 20F is a front view; and FIG. 20G is a sectional view taken along line 20g—20g of FIG. 20A.

Figure 21B:
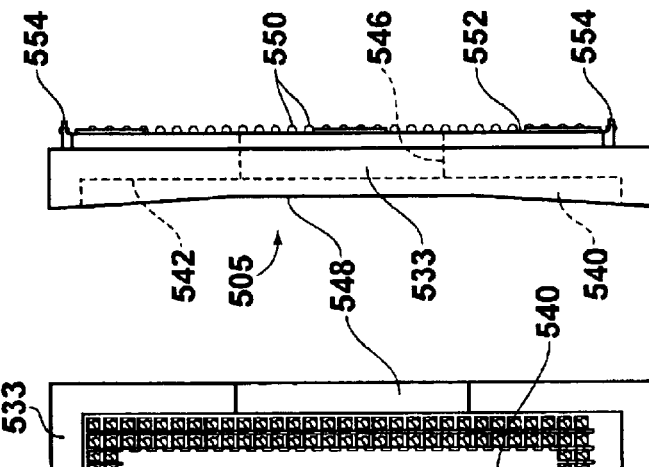
Figure 21A:
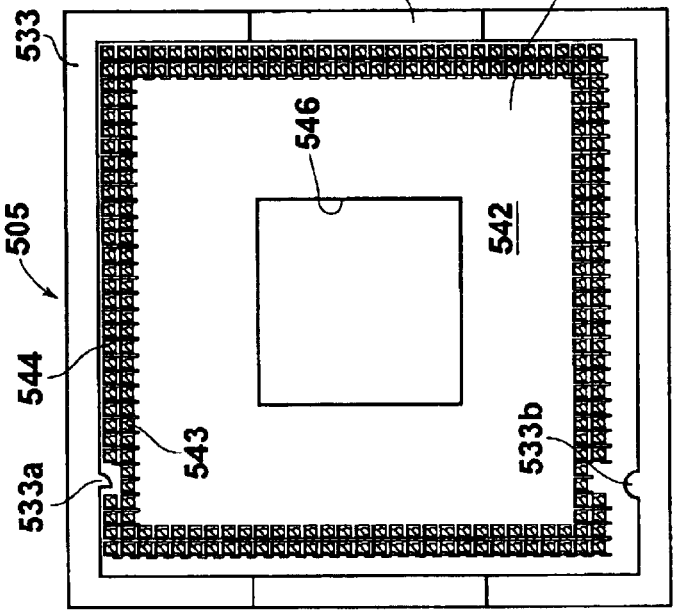
Figure 21C:
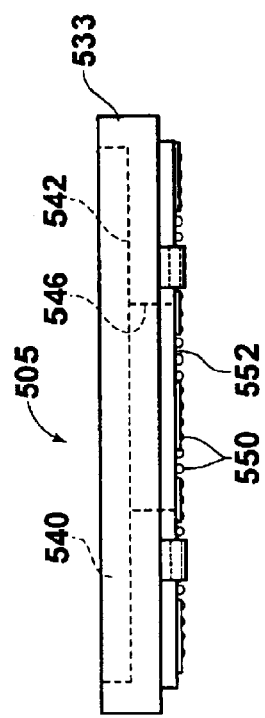

FIG. 21 shows an insulative housing of the LGA socket of FIG. 18; FIG. 21A is a plan view; FIG. 21B is a side view; and FIG. 21C is a front view.

FIG. 22 shows the insulative housing placed on but not yet attached to the metallic reinforcing plate; FIG. 22A is a bottom view; and FIG. 22B is a side view.

FIG. 23 shows the insulative housing secured to the metallic reinforcing plate; FIG. 23A is a bottom view; and FIG. 23B is a side view.

FIG. 24 shows the LGA socket of FIG. 18; FIG. 24A is a sectional view with a suction cap attached; and FIG. 24B is a sectional view with the suction cap removed and the LGA package not yet attached.

FIG. 25 is a side view of the LGA socket with a heat sink mounted thereon.

FIG. 26 is a transparent side view of the LGA socket of FIG. 24 showing a state wherein the cover member of the LGA socket presses the LGA package.

DETAILED DESCRIPTION OF THE INVENTION

Figure 1:
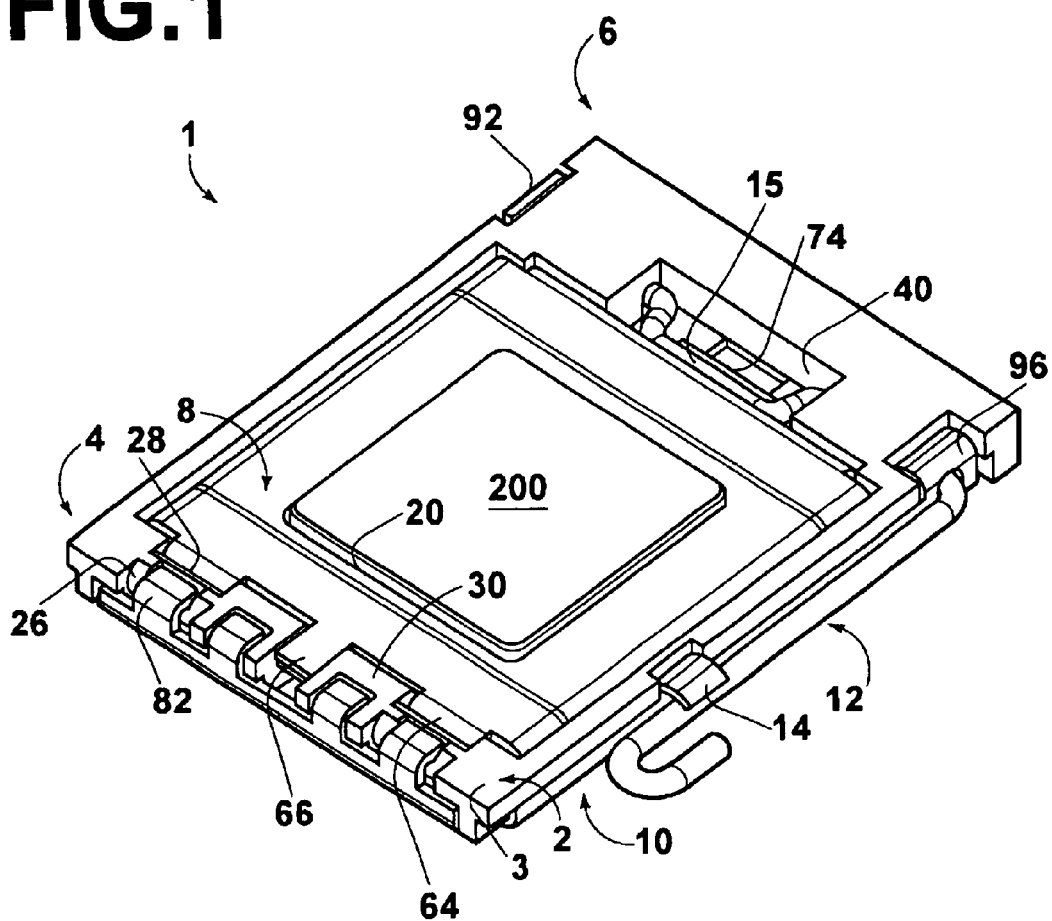
FIG. 1 is a top perspective view of a LGA socket according to a first embodiment of the invention shown with a LGA package.
Figure 2:
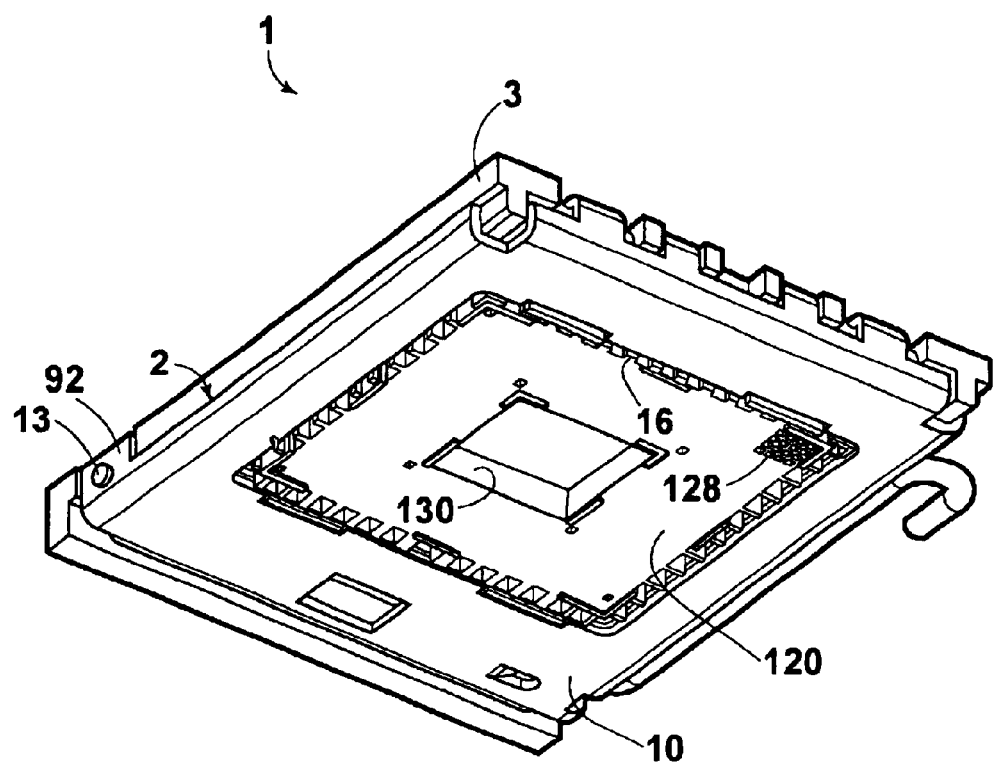
FIG. 2 is a bottom perspective view of the LGA socket of FIG. 1.
Figure 6A:
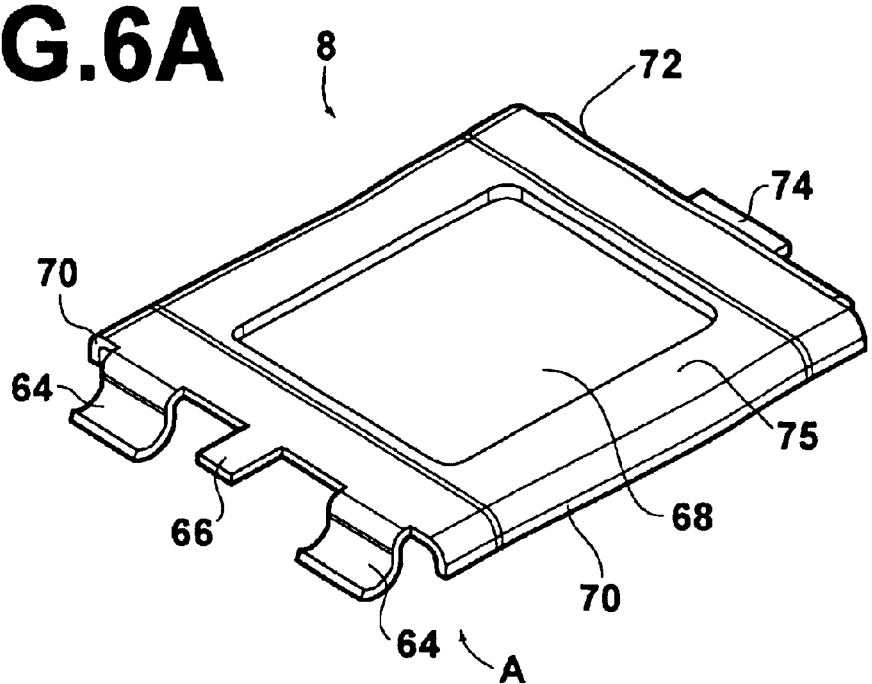
FIG. 6A is a top perspective view.

FIG. 1 shows a land grid array (LGA) socket 1 (hereinafter, simply referred to as "socket") according to a first embodiment of the invention with a LGA package 200 fitted therein. As shown in FIGS. 1 and 2, the socket 1 includes an insulative housing 2 molded from resin or the like (hereinafter, simply referred to as "housing"). The housing 2 has a rectangular frame body comprising an outer housing 3 and an inner housing 120. A cover member 8 is pivotally mounted on a first end 4 of the housing 2. The cover member 8 has a rectangular opening 68 (FIG. 6A). As shown in FIG. 2, a metallic reinforcing plate (hereinafter, simply referred to as "reinforcing plate") 10 is attached to a bottom surface 11 (FIG. 3B) of the housing 2. A lever 12 is pivotally supported on a second end 6 of the housing 2. The lever 12 engages with a free end of the cover member 8 to lock the cover member 8 to the housing 2.

Figure 3A:
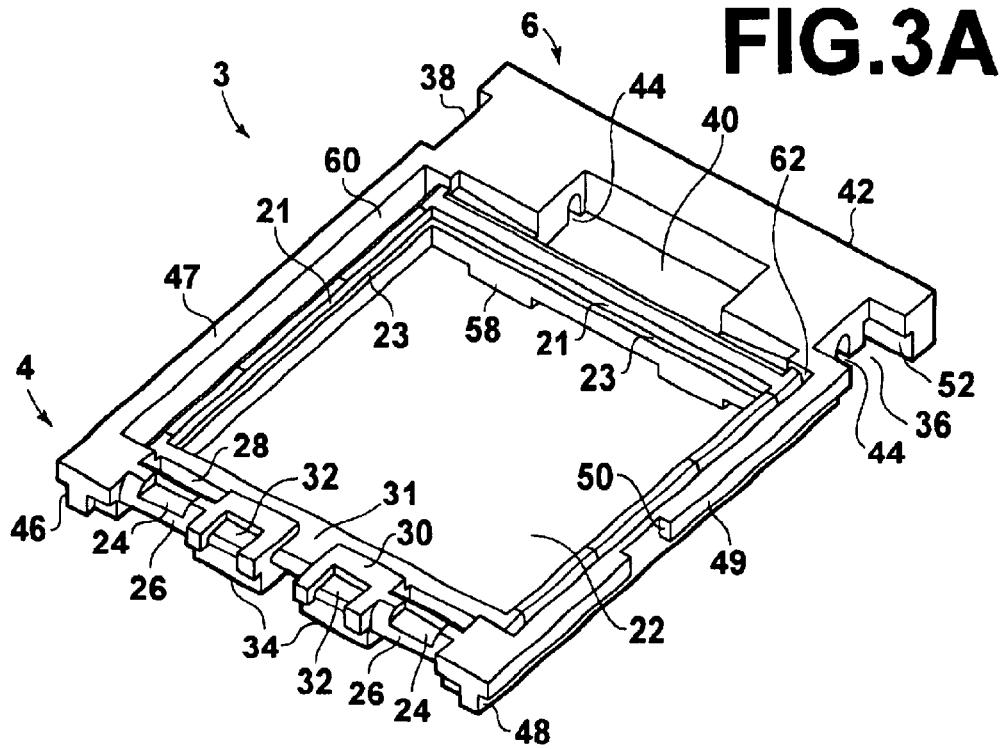
FIG. 3A is a top perspective view.
Figure 3B:
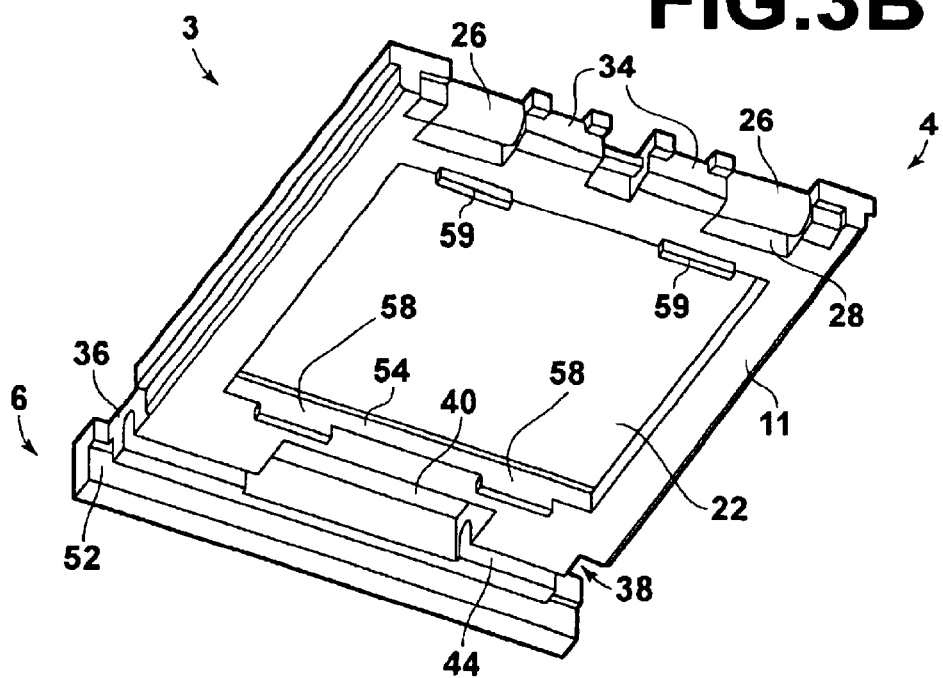
FIG. 3B is a bottom perspective view.

The individual elements of the socket 1 will now be described in greater detail. As shown in FIG. 3, the outer housing 3 is shaped in the form of a rectangular frame and has a centrally disposed rectangular opening 22. Projections 58, 58, 59, 59, which are spaced apart from one another and extend downward, are formed in an inner wall 21 of the opening 22 on the first end 4 and the second end 6. An upward-facing step 23 for positioning the inner housing 120 is formed within the opening 22 of the outer housing 3 along the inner wall 21 of the opening 22. A pair of spaced apart cylindrical shafts 26 is formed at the first end 4 of the housing 2 for pivotally mounting the cover member 8. Each of the shafts 26 has a top portion with a flat notch or first receiving seat 24. Gaps 28 for connecting the cover member 8 vertically extend through the outer housing 3 and are formed at portions between the respective shafts 26 and the opening 22 adjacent to each of the first receiving seats 24. A pair of generally rectangular convex surfaces 30 that are separated from one another is formed between the shafts 26. A recess or second receiving seat 32, which is open upward and outward, is formed in each of the convex surfaces 30. The first and second receiving seats 24, 32 are arranged at the same height and aligned in the same direction. At a bottom portion of each of the second receiving seats 32, a rectangular block 34 having a thickness the same as the outer housing 3 is formed.

Vertically extending hollows 36, 38 are formed on both sides of the outer housing 3 and closer to the second end 6. The hollow 36 is formed to be deeper than the hollow 38. A rectangular opening 40 is formed between the hollows 36, 38 for accommodating a locking portion 15 of the lever 12 (FIG. 1). A U-shaped groove 44, which extends parallel to a rear wall 42 and is open downward, communicates with the opening 40 and the hollows 36, 38. Sidewalls 46, 48 extend between the first end 4 and the second end 6. First and second protruding walls 47, 49 are formed along the sidewalls 46, 48, respectively. The first protruding wall 47 is continuous, and the second protruding wall 49 has a notch 50 formed in a middle thereof for the interlocking protrusion 14 of the reinforcing plate 10. A groove 52, which opens downward, is formed near the U-shaped groove 44 and extends along the rear wall 42. Clearance grooves 60, 62, which extend respectively along the sidewalls 46, 48 and are open upward, are formed in the vicinity of the opening 22 and inside the sidewalls 46, 48. The clearance grooves 60, 62 are formed to receive sidewalls 70, 70 of the cover member 8.

As shown in FIGS. 4 and 5, the inner housing 120 has a rectangular shape and has external dimensions that permit the inner housing 120 to be press-fit inside the inner wall 21 of the opening 22 of the outer housing 3. A top portion of the inner housing 120 has a package receiving part 124 that is defined by an outer peripheral wall 122. A portion of the outer peripheral wall 122 is pressed inside the inner wall 21. An opening 130 is formed in a bottom surface 126 of the package receiving part 124. A large number of cavities 128 for accommodating contacts (not shown) are formed in a matrix pattern on the bottom surface 126. Although FIG. 4 shows only a part of the cavities 128, the cavities 128 are formed substantially all over the bottom surface 126 except in the opening 130.

As shown in FIG. 5, on the bottom surface of the inner housing 120, a downward-facing step 132 is provided along the entire periphery of the inner housing 120. The downward-facing step 132 abuts against the upward-facing step 23 when the inner housing 120 is positioned within the opening 22 of the outer housing 3. Rectangular apertures 134 and recesses 135 are disposed along the outer peripheral wall 122. The rectangular apertures 134 and the recesses 135 reduce wall thickness to prevent shrinkage after the inner housing 120 is molded from resin. A standoff 136 formed on the bottom surface of the inner housing 120 maintains the spacing between a printed circuit board (not shown) and the inner housing 120 when the socket 1 is mounted on the printed circuit board (not shown).

Figure 6B:
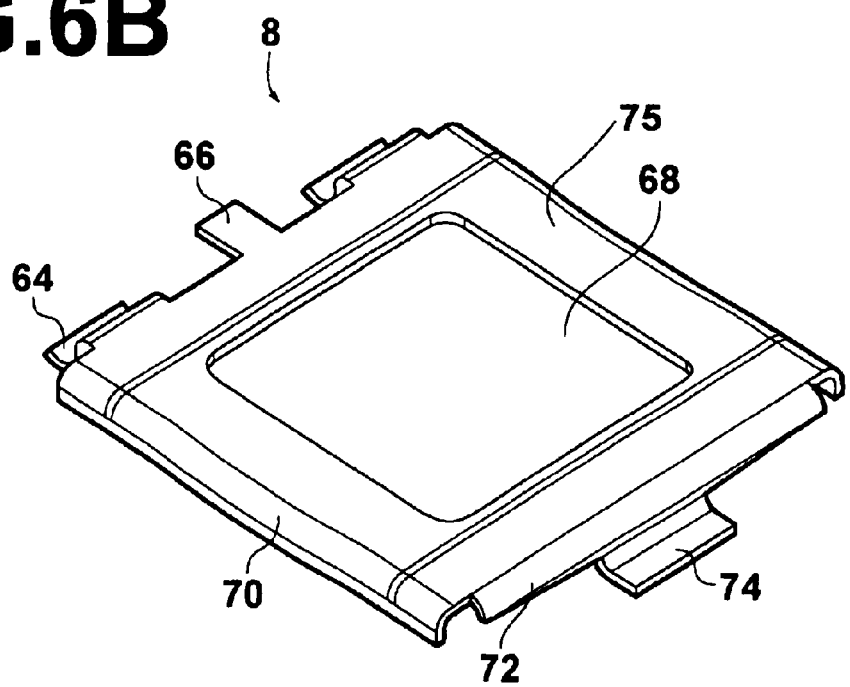
FIG. 6B is another top perspective view.

As shown in FIG. 6, the cover member 8 is formed by stamping and bending a single sheet of metal into a rectangular shape. The cover member 8 has a front part A located at the first end 4 of the socket 1 and a rear part opposite the front part A located at the second end 6 of the socket 1. The cover member 8 has a pair of bearing tongues 64 projecting from the front part A. The bearing tongues 64 are curved downward and spaced from one another. A holding element 66 is formed midway between the bearing tongues 64. The holding element 66 projects towards the front part A and is formed at the same height as the cover member 8. The rectangular opening 68 into which the LGA package 200 (FIG. 1) is positioned is formed at a center of the cover member 8. Opposite edges of the cover member 8, between the front part A and the rear part, are bent downward to form side surfaces 70. A rear wall 72 is formed at the rear part of the cover member 8 by bending down a rear edge. A locking element 74 projects downward from a middle portion of the rear wall 72 and extends horizontally in an outward direction. The locking element 74 is formed to engage with the lever 12. An upper surface 75 of the cover member 8 is curved slightly downward so that a force is applied uniformly across the LGA package 200 when the cover member 8 presses the LGA package 200 against the socket 1.

Figure 7:
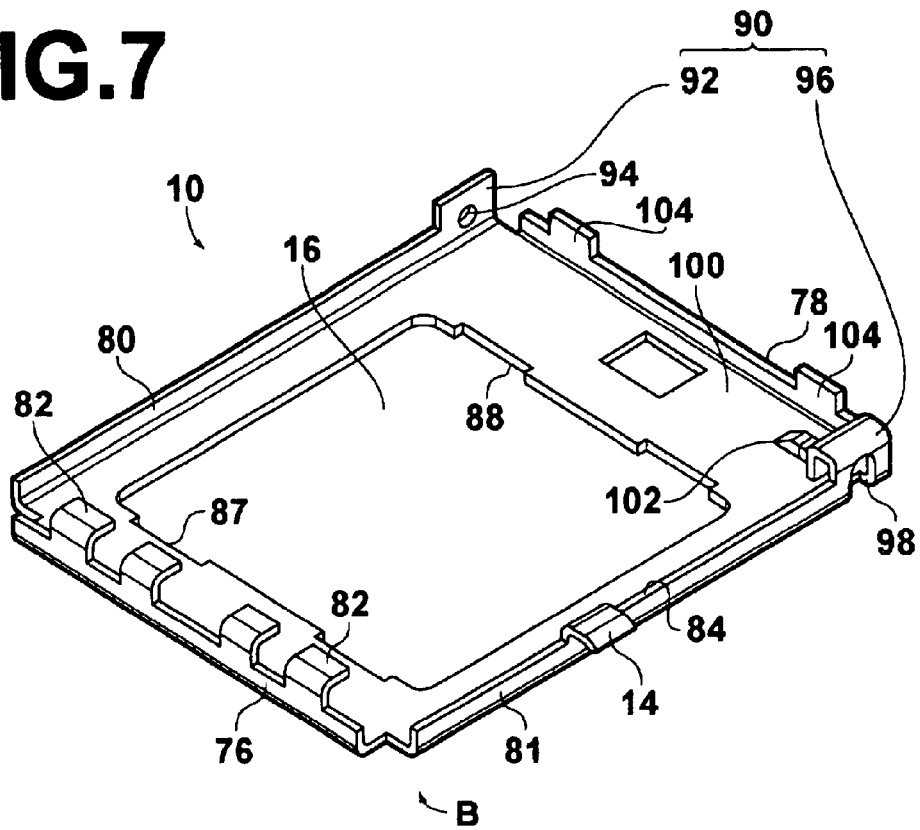
FIG. 7 is a top perspective view of a metallic reinforcing plate of the LGA socket of FIG. 1.

As shown in FIG. 7, the reinforcing plate 10 is formed by stamping and bending a single sheet of metal into a rectangular plate with a large rectangular opening 16 formed at a center thereof. The reinforcing plate 10 is provided on the bottom surface 11 (FIG. 3B) of the outer housing 3 so as to extend substantially along a perimeter of the outer housing 3. Notches 87, 88 that correspond to the projections 59, 58 of the outer housing 3 are provided at front and rear edges of the opening 16. The projections 59, 58 are adapted to mate respectively with the notches 87, 88 such that the relative positional relationship between the reinforcing plate 10 and the cover member 8 is established. The reinforcing plate 10 has a front part B located at the first end 4 of the socket 1 and a rear part opposite the front part B located at the second end 6 of the socket 1. Side edges of the reinforcing plate 10 are bent upward to form a front wall 76, a rear wall 78, and sidewalls 80, 81.

The front wall 76 has generally L-shaped retaining elements 82 that project upward and are bent inward. The retaining elements 82 are spaced apart from one another and disposed so as to correspond with the first and second receiving seats 24, 32 of the outer housing 3. Each of the retaining elements 82 has a sufficient height to accommodate an edge of the front part of the outer housing 3.

The sidewall 80 is formed to extend in a front-rear direction of the reinforcing plate 10. An interlocking element 14 is formed integrally with the sidewall 81 on an upper edge 84 thereof at a position corresponding to the notch 50 of the outer housing 3 so that the interlocking element 14 extends laterally towards an exterior of the reinforcing plate 10 in a direction substantially perpendicular to a surface of the sidewall 81. The downward-facing surface of the interlocking element 14 is concave in order to make the lever 12 hard to remove therefrom when the lever 12 is engaged with the interlocking protrusion 14. A shaft-supporting portion 90 for pivotally supporting the lever 12 is provided at rear ends of the sidewalls 80, 81. The shaft-supporting portion 90 has an upwardly projecting shaft-supporting element 92 formed on a side of the sidewall 80, and an inverted U-shape shaft-supporting element 96 formed on a side of the sidewall 81. The shaft-supporting element 92 has an aperture 94, and the shaft-supporting element 96 has oblong slots 98 that extend in a vertical direction (only one of the slots 98 is shown). The aperture 94 and the slots 98 cooperatively serve as a bearing for supporting the lever 12. A tongue element 102 is formed near the shaft-supporting element 96 by cutting a portion of a bottom surface 100 of the reinforcing plate 10 and bending this portion upward. The tongue element 102 is adapted to support a rotary shaft 13 (FIG. 8) of the lever 12 inserted into the slots 98 from underneath.

The rear wall 78 has projections 104 that are spaced apart from one another and extend upward. The projections are positioned to mate with mounting slots (not shown) formed in the groove 52 of the outer housing 3. When the reinforcing plate 10 is attached to the outer housing 3, the front part of the outer housing 3 is held by the retaining elements 82, and the projections 104 are pressed into the mounting slots (not shown) of the outer housing 3. During insertion of the projections 104, it is preferable that the projections 104 are heated and then pressed into the mounting slots (not shown)

of the outer housing while partially heat-softening the mounting slots 104.

Figure 8:
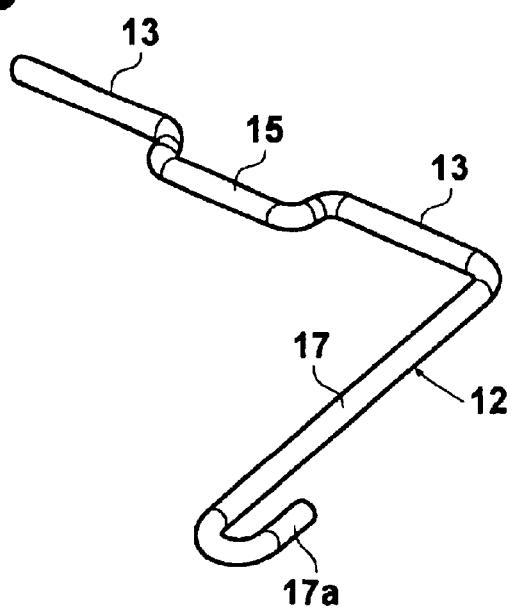
FIG. 8 is a perspective view of a lever of the LGA socket of FIG. 1.

As shown in FIG. 8, the lever 12 is formed by bending a single metallic wire and comprises rotary shafts 13 which are spaced apart from one another and supported by the shaft-supporting portion 90 of the reinforcing plate 10. A crank portion or a locking portion 15 is disposed between the rotary shafts 13 and is displaced with respect to the rotary shafts 13. An actuating portion 17 for rotating the rotary shafts 13 is bent at a right angle with respect to the rotary shafts 13 in substantially the same direction as the locking portion 15. A tip of the actuating portion 17 is formed into a U-like shape in order to form a U-shaped portion 17a for ease of actuation by a finger. The lever 12 is secured in position by the interlocking element 14 of the reinforcing plate 10 and disposed within the U-shaped groove 44 of the outer housing 3.

Figure 10:
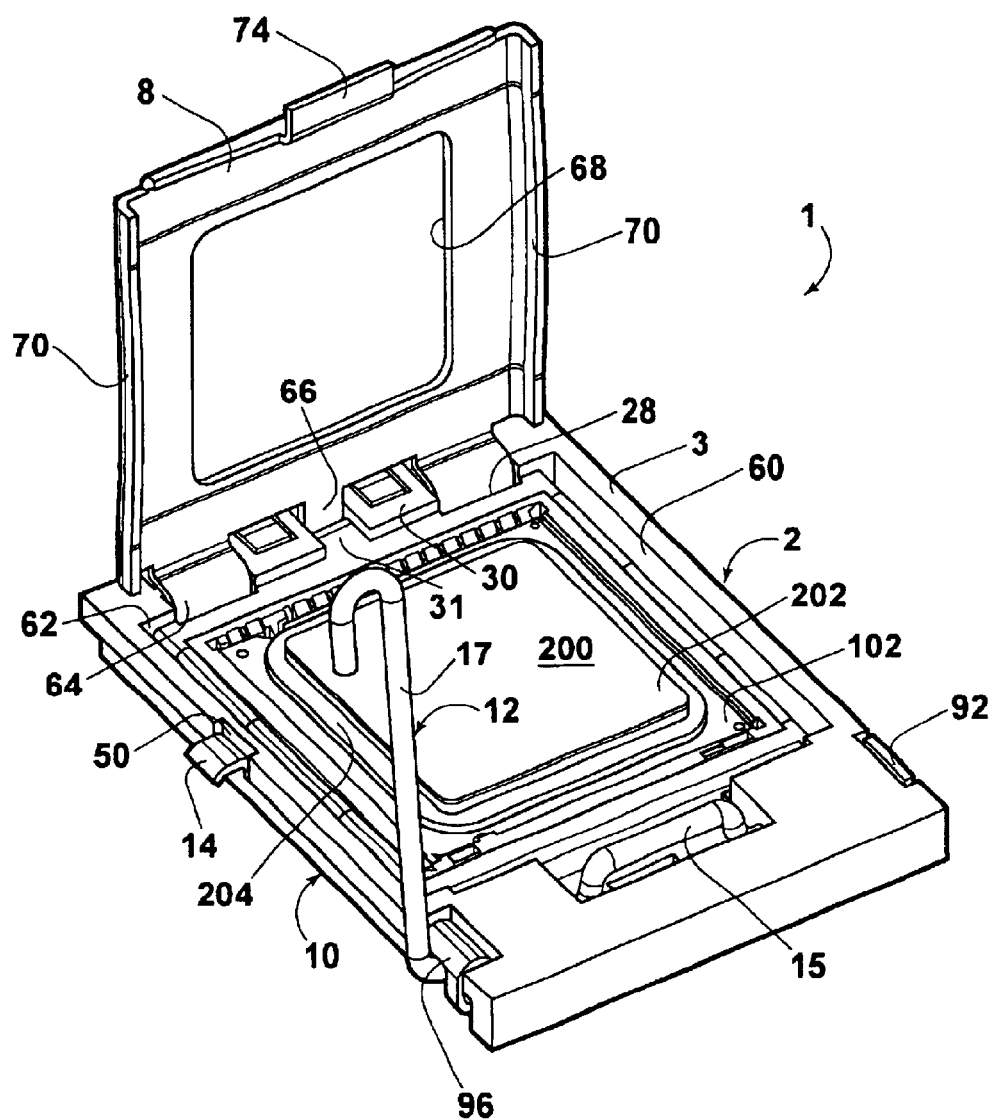
FIG. 10 is another top perspective view of the LGA socket of FIG. 1 with the cover member open.
Figure 13A:
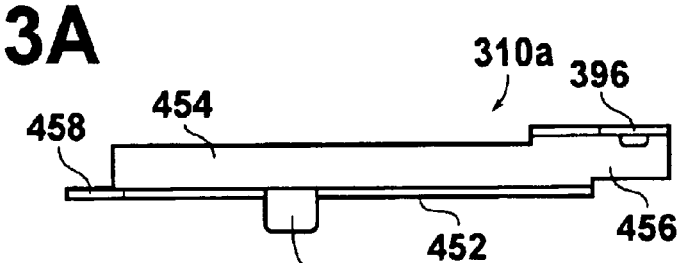
FIG. 13A is a plan view.
Figure 13B:
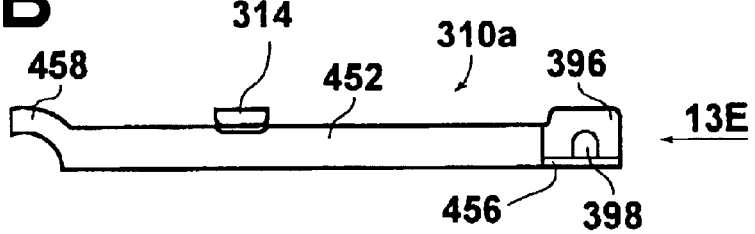
FIG. 13B is a front view.
Figure 13C:
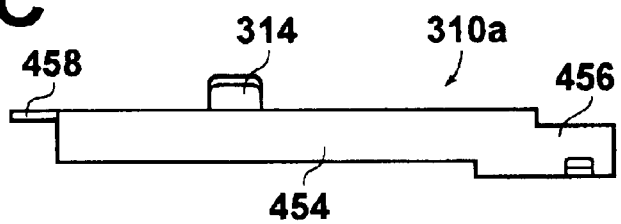
FIG. 13C is a bottom view.
Figure 13D:
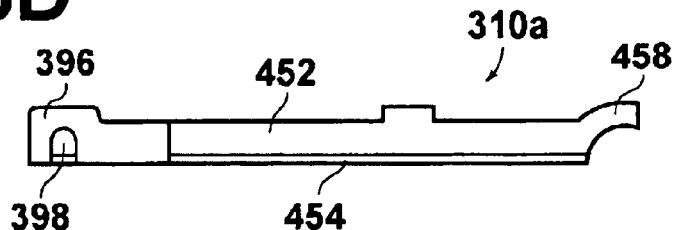
FIG. 13D is a rear view.
Figure 13E:
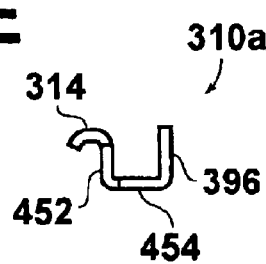
FIG. 13E is a side view taken along arrow 13E of FIG. 13B.
Figure 14A:
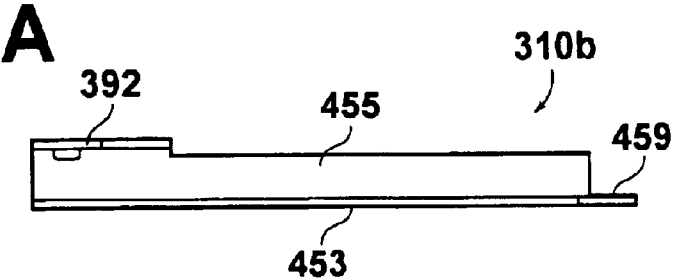
FIG. 14A is a plan view.
Figure 14B:
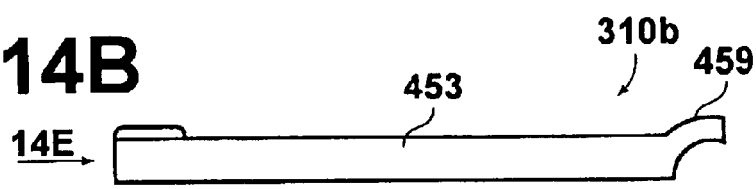
FIG. 14B is a front view.
Figure 14C:
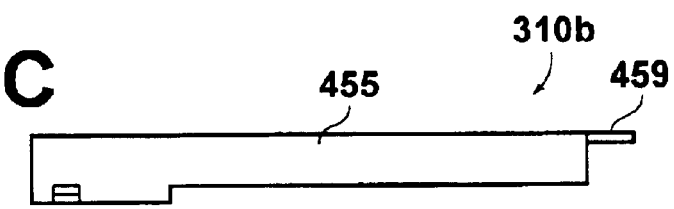
FIG. 14C is a bottom view.
Figure 14D:
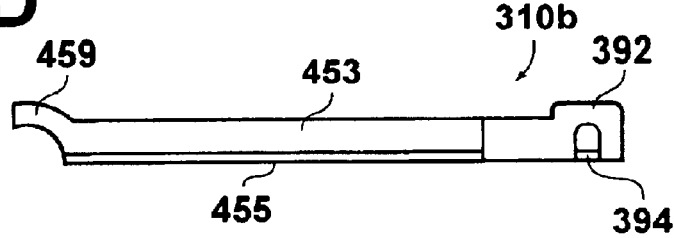
FIG. 14D is a rear view.
Figure 14E:
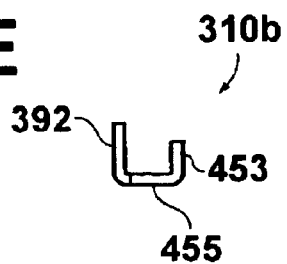
FIG. 14E is a side view taken along arrow 14E of FIG. 14B.
Figure 15A:
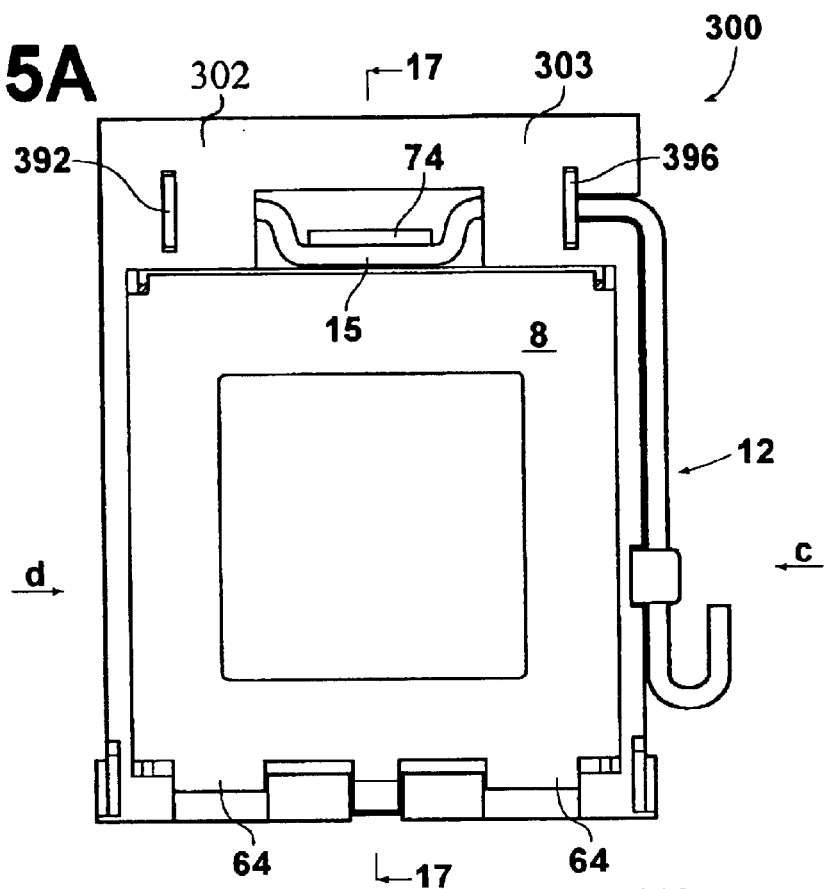
FIG. 15A is a plan view.
Figure 15B:
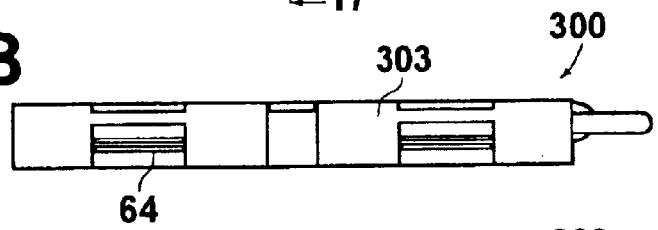
FIG. 15B is a front view.
Figure 15C:
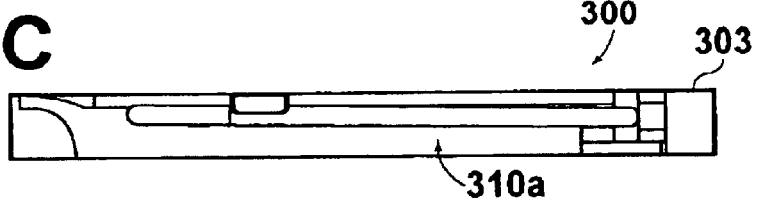
FIG. 15C is a side view taken along arrow 15C of FIG. 15A.
Figure 15D:
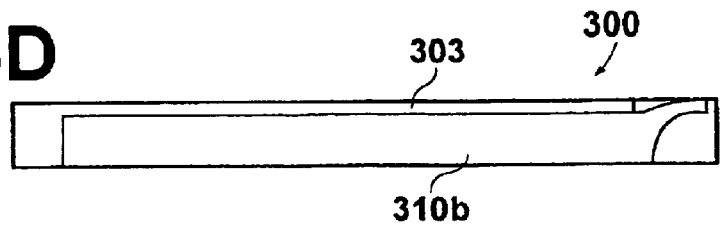
FIG. 15D is a side view taken along arrow 15D of FIG. 15A.

As shown in FIG. 10, the LGA package 200 has a raised portion 202 that is generally complementary with respect to the opening 68. A flange 204 extends about the circumference of the raised portion 202. The raised portion 202 is of a size such that the raised portion 202 may be received in the opening 68 of the cover member 8.

Figure 9:
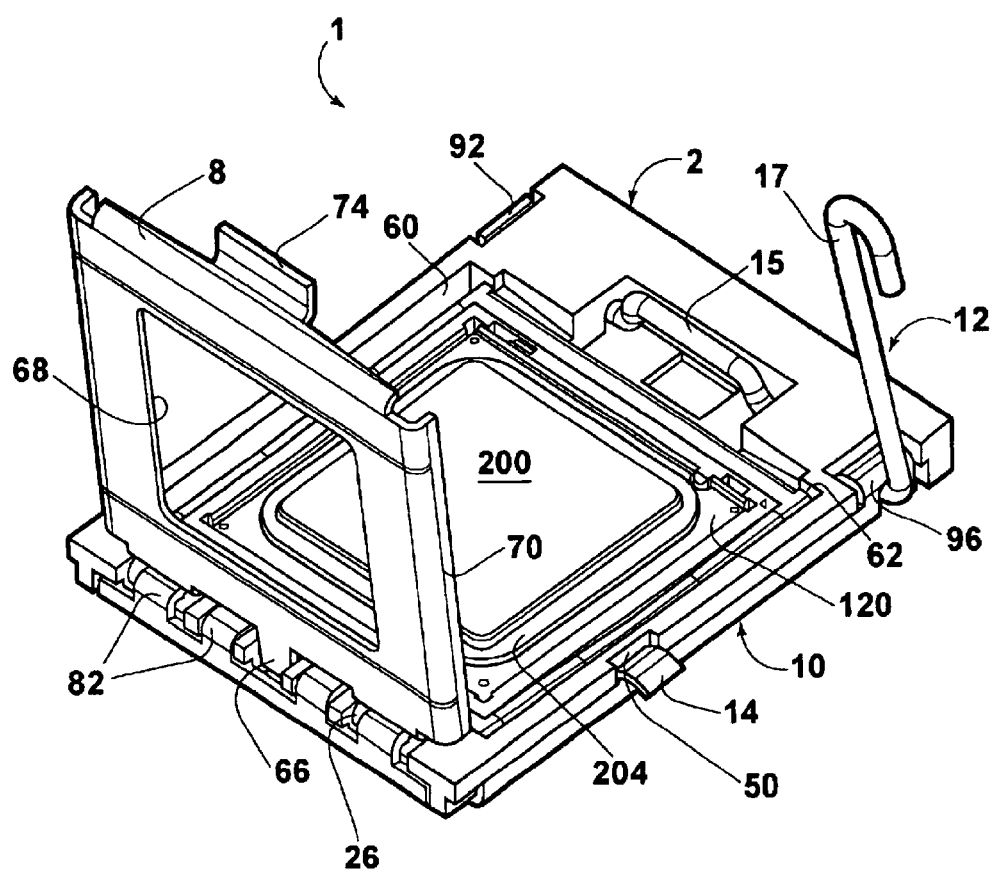
FIG. 9 is a top perspective view of the LGA socket of FIG. 1 with the cover member open.

Assembly of the socket 1 will now be described in greater detail. As shown in FIG. 10, the bearing tongues 64 of the cover member 8 are inserted into the gap 28 of the outer housing 3. The holding element 66 is disposed between the convex surfaces 30 at an edge of the outer housing 3 and suppresses the movement of the cover member 8 towards the direction in which the cover member 8 falls out from the gap 28. The bearing tongues 64 are slidably disposed around the shafts 26 and pivotally support the cover member 8. As shown in FIGS. 9 and 10, the inner housing 120 is disposed within the opening 22 of the outer housing 3. The clearance grooves 60, 62 are not covered by the inner housing 120, but are adapted to respectively accommodate the sidewalls 70 of the cover member 8 when the cover member 8 is closed.

As shown in FIGS. 9 and 10, the reinforcing plate 10 is disposed on the bottom surface 11 of the outer housing 3. The interlocking element 14 of the reinforcing plate 10 is positioned within the notch 50 of the outer housing 3. As best shown in FIG. 9, the retaining elements 82 of the reinforcing plate 10 are positioned within the first and second receiving seats 24, 32 of the outer housing 3 and attached to the housing 2. The retaining elements 82 located within the first receiving seats 24 are engaged with the cover member 8 via the shaft 26. The retaining elements 82 also serve as a stopper that limits the rotational range of the cover member 8. The lever 12 is pivotally supported by the shaft-supporting elements 92, 96 of the reinforcing plate 10.

Operation of the socket 1 will now be described in greater detail. As shown in FIGS. 9 and 10, the actuating portion 17 of the lever 12 is raised so that the locking portion 15 of the lever 12 is disengaged from the locking element 74 of the cover member 8, and the cover member may be positioned in an open position. The LGA package 200 is placed on top of the inner housing 120. As shown in FIGS. 1 and 2, the cover member 8 is pivoted to the closed position and is locked by the shaft 26. The actuating portion 17 of the lever 12 is lowered to lower the locking portion 15 of the lever 12, which in turn presses downward on the cover member 8. When the cover member 8 is closed, a peripheral edge of the opening 68 of the cover member 8 presses the flange 204 of the LGA package 200 towards an upper surface of the inner housing 120 to cause the contacts (not shown) of the LGA package 200 to electrically connect to the contacts (not shown) in the housing 2. At this time, the force applied to the lever 12 is supported by the shaft-supporting elements 92, 96 of the reinforcing plate 10. At the first end 4, the reinforcing plate 10 is engaged with the shaft 26 of the outer housing 3, and the housing 2 is supported by the rigid metal cover member 8 and the reinforcing plate 10. Accordingly, the downward force caused by the cover member 8 pressing the LGA package 200 is supported by the reinforcing plate 10 and deformation of the housing 2 is prevented.

In the socket 1, the metallic reinforcing plate 10 may be easily attached to the housing 2 without having to use screws. Further, the metallic reinforcing plate 10 may be attached within the range of the footprint of the socket 1, which permits the size of the footprint to fit within the range of the socket area while ensuring the strength thereof. Because the interlocking portion 14 of the lever 12 is formed integrally with the reinforcing plate 10, the interlocking potion 14 is hardly worn due to lever operations and, therefore, the LGA socket 1 has high wear resistance and good durability. The reinforcing plate 10 is formed as a one-piece component which extends along the entire periphery of the housing 2, and the housing 2 is thereby held entirely around the periphery thereof. This configuration contributes to powerful resistance against deformation of the housing 2. Additionally, because the metallic reinforcing plate 10 is a one-piece component, it may easily be attached to the housing 2.

A LGA socket 300 according to a second embodiment of the invention will now be described with reference to FIGS. 11 through 19. Elements of the second embodiment that are the same as the elements of the first embodiment will be identified with the same reference numerals and further description and illustration thereof will be omitted. The main difference between the socket 300 of the second embodiment and the socket 1 of the first embodiment is that a metallic reinforcing plate of the socket 300 has first and second metallic reinforcing plate members 310a, 310b.

As shown in FIG. 15, the socket 300 has a housing 302 comprising an outer housing 303 and an inner housing 120. The housing 302 has a lever 12 and a cover member 8 with a locking element 74 and a bearing tongue 64. As shown in FIGS. 11 and 12, protruding walls 347, 349 extend from a first end 304 to a second end 306 of the outer housing 303. The protruding walls 347, 349 are formed at each upper edge of lateral portions of the outer housing 303. First grooves 438, 440 are respectively formed below and extend along the protruding walls 347, 349. As best shown in FIG. 12A, the first grooves 438, 440 communicate with second grooves 439, 441 formed along a bottom of the outer housing 303. As shown in FIG. 11, an arcuate interlocking portion 444 having an upward-facing rib 442 is formed in the lateral portions of the outer housing 303 on the first end 304 side. An arcuate interlocking groove 446 is formed within each arcuate interlocking portion 444 for fitting of a reinforcing plate 310 (FIGS. 13 and 14). Provided in the bottom surface on the second end 306 side of the outer housing 303 is a U-shaped groove 344. Slots 448, 449 communicate with the U-shaped groove 344 and are formed in a front-rear direction of the outer housing 303 and vertically extend through the outer housing 303. One of the slots 449 has a passageway 450 that opens toward a side of the outer housing 303. Similar to the first embodiment, the outer housing 303 is provided with openings 322, 340, a shaft 326, a gap 328, and a notch 350.

As shown in FIGS. 13 and 14, the metallic reinforcing plate 310 is formed by the first and second metallic reinforcing plate members 310a, 310b, respectively. The first reinforcing plate member 310a shown in FIG. 13 is formed by stamping and bending a single sheet of metal into an elongated shape. The first reinforcing plate member 310a comprises a main wall 452 received in the first groove 440, and a bottom wall 454 received in the second groove 441. An extension 456, which is deflected to extend in a right hand direction, is formed in the bottom wall 454 on the second end 306 (FIG. 11A). The extension 456 is provided with a shaft-supporting element 396 that is pressed into and engaged with the slot 449. The shaft-supporting element 396 has a U-shaped slot 398 for pivotally supporting the lever 12 (FIG. 15). An arcuate interlocking element 458 to be engaged with the arcuate interlocking groove 446 is formed at an end of the main wall 452 on a side opposite the extension 456. An interlocking element 314 is provided in a protruding manner at an upper edge of the main wall 452 such that it mates with the notch 350 of the outer housing 303.

The second reinforcing plate member 310b shown in FIG. 14 comprises a main wall 453 that is received in the first groove 438, and a bottom wall 455 that is received in the second groove 439. A shaft-supporting element 392 is disposed to face a main wall 453 and projects from a bottom wall 455 at an end thereof. An upper edge of the shaft-supporting element 392 is made higher than the upper edge of the main wall 452 such that the shaft-supporting element 392 may be pressed into and locked by the slot 448. The shaft-supporting element 392 has a U-shaped slot 394 for pivotally supporting the lever 12. An arcuate interlocking element 459 to be engaged with the arcuate fastening groove 446 is formed at the end of the main wall 452 on a side opposite the shaft-supporting element 392.

Figure 16:
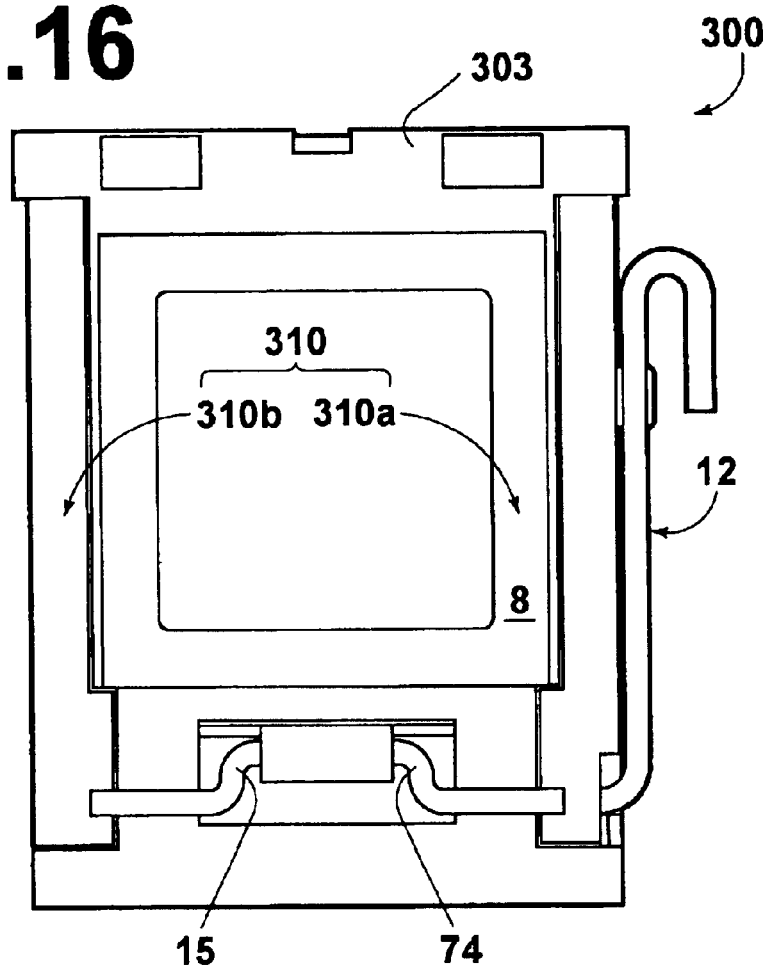
FIG. 16 is a bottom view of the LGA socket of FIG. 11.
Figure 17:
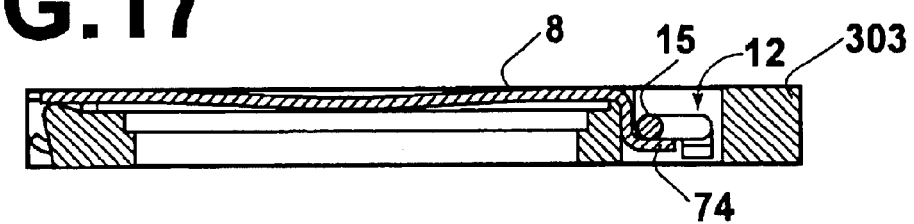
FIG. 17 is a sectional view of the LGA socket taken along line 17—17 of FIG. 15A.

In the second embodiment, the reinforcing plate 310 formed by the first and second reinforcing plate members 310a, 310b is mounted on the bottom surface of the outer housing 303 so that the outer housing 303 is arranged between the metallic reinforcing plate 310 and the cover member 8, as shown in FIGS. 15 and 16. The first and second reinforcing plate members 310a, 310b are both mounted to the bottom surface of the outer housing 303 to reinforce the outer housing 303 from the sides to the bottom surface. The lever 12 is pivotally supported by the shaft supporting elements 396, 392 of the first and second reinforcing plate members 310a, 310b. The bearing tongue 64 of the cover member 8 engages with the outer housing 303, and the locking element 74 of the cover member 8 is locked by the locking portion 15 of the lever 12 when the cover member 8 is closed in the same manner as in the first embodiment.

Because the housing 302 is supported by the reinforcing plate 310 on the two sides extending between the first end 304 and the second end 306, deformation of the housing 302 is prevented when a force is exerted on the housing 302 during connection of the LGA package 200. Additionally, the second embodiment has a decreased weight because the metallic reinforcing plate 310 does not extend entirely about the circumference of the bottom of the housing 302. Because the cover member 8 is configured to be pivotally supported by the reinforcing plate 310 on the first end 304 of the housing 302, excessive load is not imposed to even the first end 304 of the housing 302 so that deformation of the housing 302 may be prevented. Further, because both the cover member 8 and the reinforcing plate 310 have apertures for the shaft 326, and the cover member 8 is constituted by a metallic shaft member separated from the reinforcing plate 310 and pivotally supported by the reinforcing plate 310, the configurations of the cover member 8 and reinforcing plate 310 are simplified.

A LGA socket 501 according to a third embodiment of the invention will now be described with reference to FIGS. 18 through 21. As shown in FIG. 18, the socket 501 comprises an insulative housing 505 accommodated in a reinforcing plate 510, a cover member 508 pivotally mounted at a first end of the reinforcing plate 510, and a lever 512 for locking the cover member 508. The lever 512 is pivotally supported on a second end of the reinforcing plate 510, opposite the first end, and adapted to engage with a locking element 574 which is positioned at a free end of the cover member 508 when the housing 505 is closed by the cover member 508. The socket 501 of the third embodiment is different from the sockets 1, 300 of the first and second embodiments in that the cover member 508 is directly engaged with the reinforcing plate 510 without the intermediary of the housing 505. This configuration reduces deformation of the housing 505 by avoiding undue bending stresses with respect to the housing 505.

The individual elements of the socket 502 will now be described in greater detail. However, no further description or illustration will be given of elements that are the same as the elements of the aforementioned embodiments. As shown in FIG. 21, the housing 505 is molded from an insulating material in a rectangular shape. The housing 505 has a package-receiving portion 540 surrounded by an outer peripheral wall 533. A large number of cavities 544 are formed in a matrix pattern on a bottom surface 542 of the package-receiving portion 540. Although only a portion of the cavities 128 is shown, the cavities 544 are formed substantially all over the bottom surface 541 except the opening 546. Contacts 543 are disposed within the cavities 544. As best shown in FIG. 24, the housing 505 has a step 558.

As shown in FIG. 21, two types of protrusions 533a, 533b, which serve as keys when receiving the LGA package 529, are disposed inside the peripheral wall 533. Recesses 548 are formed on opposite sides of the peripheral wall 533 (one on each side). The recesses 548 are shaped to correspond to a curve of the cover member 508. The recesses 548 serve as a clearance for preventing interference of the housing 505 with a curved surface of the cover member 508 when the cover member 508 is closed and, thus, placed on the housing 505. Soldering balls 550 for connecting to a printed circuit board (not shown) extend from the contacts 543 and project from a lower surface 552 of the housing 505. As best shown in FIGS. 21B and 22A, swaging portions are integrally molded from resin with the housing 505 and project from the lower surface 552 thereof. Recesses 556 are formed adjacent to the swaging portions.

As shown in FIG. 19, the reinforcing plate 510 is a generally rectangular plate having a rectangular opening 516. The reinforcing plate 510 has end walls 502, 503 and sidewalls 507 (507a, 507b) formed around its entire periphery. A stop wall 521 is provided along the extended line from an end of the end wall 502. Notches (engagement portions) 528a are formed in the opposite end edges 528 of the opening 516. The notches 528a are provided as portions to which the housing 505 is mounted by a thermal pressing technique.

First and second supporting portions 506, 504 for pivotally supporting the lever 512 are formed in one piece with the end wall 502. The first and second supporting portions 506, 504 project from the end wall 502 and are bent inward away from the end wall 502. The first supporting portion 506 comprises a first plate portion 506a bent inward and extending away from the end wall 502. A supporting tongue element 518 (FIG. 18C) is bent from a side part near a tip of the first plate portion 506a. The supporting tongue element 518 has an arcuate portion 518a which cooperates with the first plate portion 506a to support therebetween a rotary shaft 513 of the lever 512. The second supporting portion 504 comprises a second plate portion 504a bent inward and extending away from the end wall 502 similar to the first plate portion 506a. As best shown in FIGS. 19A and 19D, the second supporting portion 504 includes a pressing tongue element 504b that extends obliquely downward from the second plate portion 504a. Side surface 515a of the locking portion 515 come into abutment with the pressing tongue element 504b and block leftward movement of a locking portion 515 of the lever 512 to prevent the locking portion 515 from falling in a left-hand direction of FIG. 18B. A rectangular opening 509 disposed between the first and second supporting portions 504, 506 serves as a clearance for the locking element 574 of the cover member 508 when the locking element 574 is locked by the locking portion 515 of the lever 512.

As shown in FIG. 19, the sidewall 507a has an edge at a first end thereof that is bent inward at a right angle to form a rotary shaft 523 for the cover member 508. A first end of the sidewall 507b also has a rotary shaft 526 that is formed to correspond with the rotary shaft 523. At a second end of the sidewall 507a is a shaft-supporting element 524. The shaft-support element 524 is bent obliquely inward and has an upward-facing arcuate portion 524a for supporting the shaft 512b of the lever 512. The rotary shaft 513 of the lever 512 is rotatably supported by the second plate portion 504a and shaft-supporting element 524, and the first plate portion 506a and arcuate portion 518a so that the lever 512 may be rotatably held with respect to the reinforcing plate 510 via the first and second supporting portions 506, 504. Extending from the sidewall 507a between the shaft-support element 524 and the rotary shaft 523 is an interlocking element 514.

As shown in FIG. 18, when the cover member 508 is closed, the lever 512 is engaged with the interlocking element 514. To release the engagement between the locking portion 515 of the lever 512 and the locking element 574 to open the cover member 508 when attaching the LGA package 592 or removing the LGA package 529, the lever 512 is released from engagement with the interlocking element 514 by moving the actuating portion 512a of the lever 512 in a direction indicated by arrow A so that the lever 512 rotates about the rotary shaft 513. Moving the actuating portion 512a causes displacement of the shaft 512b from the second supporting portion 504 to the actuating portion 512a, in a direction indicated by arrow B. A space 531 is provided on a side of the shaft 512b opposite the actuating portion 512a to accommodate this displacement. Without the space 531, the shaft 512b is obstructed from moving in the direction indicated by arrow B by the stop wall 521, and a larger force will be required to actuate the actuating portion 512a, which reduces the operability of the lever 512. In order to provide the space 531, the actuating portion 512a is disposed to form an obtuse angle α with the shaft 512b. The angle α is preferably within the range from 91 degrees to 95 degrees, and more preferably within the range from 92 degrees to 93 degrees. An angle formed between the rotatably-supported portion 513 and the actuating portion 512a is a right angle and only the shaft 512b is formed in a slightly inclined orientation relative to the rotatably-supported portion 513. The stop wall 521 thereby accommodates the lever 512 in an open position.

As shown in FIG. 20, the cover member 508 is formed by stamping and bending a sheet of metal. The cover member 508 has a rectangular shape and includes a rectangular opening 568. A locking element 574 is formed at a middle of a wall 571 of the cover member 508. First and second shaft-engaging portions 530, 532 are formed respectively on side surfaces 534, 535 in a vicinity of a wall 576 opposite to the wall 571. The first shaft-engaging portion 530 has a U-shaped first shaft-receiving aperture 536 on a first side of the sidewall 534 formed by stamping and bending. The second shaft-engaging portion 532 has a U-shaped notch 538 formed on a first side of the sidewall 535, and a second shaft-receiving aperture 537 formed by a major surface 508a of the cover member 508. The first shaft-receiving aperture 536 is a closed aperture. The second shaft-receiving aperture 537 is constituted by a first tongue element 537a that extends from the major surface 508a, and a second tongue element 537b that extends from the sidewall 535. The cover member 508 is mounted by first engaging the first shaft-engaging portion 530 with the rotary shaft 523 of the reinforcing plate 510 and then engaging the second shaft-engaging portion 532 with the rotary shaft 526. The first tongue element 537a is slightly inclined toward the second tongue element 537b to reduce the gap between the first and second tongue elements 537a, 537b and to prevent disengagement of the second shaft-engaging portion 532 from the rotary shaft 526. The rotary shafts 523, 526 inserted into the first and second shaft-receiving apertures 536, 357 allow the cover member 508 to be pivotally supported by the reinforcing plate 510.

As shown in FIG. 20, the major surface 508a of the cover member 508 is slightly curved. As best shown in FIG. 20A, a part of the major surface 508a of the cover member 508 extending from external edges of the cover member 508 to opposed end edges 570, 570 of the opening 568 is formed to be convex towards a side further from a person viewing the figure. The curved surfaces of areas 572, 573 have curvatures that differ from one another in that the area 572 has a smaller curvature than the area 573. For example, a radius of the curvature at the area 572 is set to be 788 mm, while the radius of curvature at the area 573 is set to be 213 mm. A middle portion of each of the end edges 570 is the most protruded portion. A LGA package 529 is pressed through these portions at pressure-applying points 570a, 570a.

As best shown in FIG. 26, the LGA package 529 has a three-layer construction. The LGA package 529 is constituted by a heat-radiating portion 529a, a load-bearing portion 529b disposed directly underneath the heat-radiating portion 529a, and a substrate 529c disposed directly underneath the load-bearing portion 529b. The load-bearing portion 529b has a larger area than that of the heat-radiating portion 529a and is provided with upward-facing steps 539. As shown in FIG. 25, a heat sink 562 is mounted to an upper surface of the heat-radiation portion 529a of the LGA package 529.

Assembly and operation of the socket 501 will now be described in greater detail. The housing 505 is placed on the reinforcing plate 510 so that the reinforcing plate 510 abuts the step 558, as shown in FIGS. 22 and 24. The swaging portions engage with the corresponding notches 528a of the reinforcing plate 510 and protrude from the lower surface 511 of the reinforcing plate 510. After the swaging portions are respectively engaged with the notches 528a of the reinforcing plate 510, the swaging portions are heat pressed. Because the swaging portions are integrally molded from resin with the housing 505, heat pressing of the protrusions 544 from the lower surface 511 of the reinforcing plate 510 results in a shape shown in FIG. 23A. The swaging portions are welded and pressed so that flattened portions 554a are formed that extend around the corresponding notch 528a. As the flattened portions 554a are cooled, they are solidified to fix the housing 505 to the reinforcing plate 510. While the swaging portions are being welded, molten material from the welding process flows into the recesses 556 so that the molten material is prevented from flowing towards and adhering to the soldering balls 550, which would adversely affect the electrical connections thereof. As best shown in FIG. 24, the reinforcing plate 510 is thereby fixed by the flattened portions 554a and the step 558 of the housing 505.

As is shown in FIG. 24A, a suction cap 560 is arranged within the package-receiving portion 540 of the housing 505 and fixed by the cover member 508. In this condition, the suction cap 560 is suctioned by a suction unit (not shown), and the socket 501 is carried to a printed circuit board (not shown) and mounted thereon. Thereafter, the suction cap 560 is removed from the socket 501, as shown in FIG. 24B.

The LGA package 529 is then attached to the package-receiving portion 540. The cover member 508 is pivoted to the open position. The LGA package 529 is inserted so that the pressure-applying points 570a abut the steps 539, one against each step to press the load-bearing portion 529 downward when the cover member 508 is pivoted to the closed position and locked by the lever 512 in a manner similar to the first and second embodiments. The cover member 508, as shown by the broken lines in FIG. 26, presses the LGA package 529. The pressure-applying points 570a undergo vertical displacement, because the pressure-applying points 570a are pressed upward by the LGA package 529. The displacement magnitude of the area 572 disposed apart from the pressure-applying points 570a, however, is small, because deformation at the area 573 controls the deformation of the cover member 508 so that the pressure-applying points 570a positively hold the LGA package 529 in a pressed state. Thus, projection of the cover member 508 beyond the upper surface of the LGA package 529 can be avoided.

As shown in FIG. 25, after the LGA package 529 is attached to the socket 501, the heat sink 562 is mounted on a board on which the socket 501 is placed on a casing (not shown) separately from the socket 501. The heat-radiation portion 529a of the LGA package 529 and a flat lower surface of the heat sink 562 contact with each other so that heat of the LGA package 529 is transferred to and dissipated by the heat sink 562. Since the upper surface 564 of the cover member 508 is curved downward and a gap A (FIG. 26) is formed between the upper surface 564 of the attached cover member 508 and the heat sink 562, the heat sink 562 will not be biased upward by the cover member 508 and released from the LGA package 529.

Because the cover member 508 is directly engaged with the lever 512 without the intermediary of the housing 505, deformation of the housing 505 is prevented. Accordingly, connections between contacts are formed smoothly, and the reliability of the electrical connection is improved. In addition, the actuating force is not absorbed due to deformation of the housing 505. Thus, impairments in the reliability of the electrical connections, due to the lack of load to bias the LGA package 529 against the contacts 543 may be prevented.

The foregoing illustrates some of the possibilities for practicing the invention. Many other embodiments are possible within the scope and spirit of the invention. For example, in the first and second embodiments, the outer housings 3, 303 may be integrally molded from a single piece of resin instead of formed separately from each other. Additionally, the cover member 8 and the reinforcing plate 10, 310 may be directly engaged with one another so that the reinforcing plate 10, 310 pivotally supports the cover member 8. In this case, the cover member 8 may have a rotary shaft and the reinforcing plate may have a rotary-shaft bearing, or vice versa. As an alternative example of direct engagement of the cover member 8 with the reinforcing plate 10, 310, it is also possible that each of the cover member 8 and the reinforcing plate 10, 310 has an aperture for a rotary shaft, and that the cover member 8 is pivotally mounted to the reinforcing plate 10, 310 by a metallic shaft member which is separate from the reinforcing plate 10, 310. Also, while the housing 505 is attached to the reinforcing plate 510 by subjecting the swaging portions of the housing 505 to thermal pressing in the third embodiment, such attachment may be accomplished by any known attachment method, which can form an appropriate engagement relationship. It is, therefore, intended that the foregoing description be regarded as illustrative rather than limiting, and that the scope of the invention is given by the appended claims together with their full range of equivalents.

We claim:

1. A land grid array socket, comprising:
   an insulative housing having a plurality of contacts, the insulative housing having a top surface for receiving a land grid array package;
   a cover member pivotally mounted on a first end of the insulative housing, the cover member being pivotal between an open position and a closed position where the cover member presses the land grid array package toward the top surface of the insulative housing so that the land grid array package electrically connects to the contacts;
   a lever pivotally mounted on a second end of the insulative housing, the lever having a locking portion for locking the cover member in the closed position; and
   a metallic reinforcing plate positioned on a bottom surface of the insulative housing, the metallic reinforcing plate extending between the first end and the second end of the insulative housing.

2. The land grid array socket according to claim 1, wherein the metallic reinforcing plate includes an interlocking portion formed to lock the lever.

3. The land grid array socket according to claim 2, wherein the interlocking portion is integrally formed with the metallic reinforcing plate.

4. The land grid array socket according to claim 1, wherein the metallic reinforcing plate is one-piece and extends along a periphery of the insulative housing.

5. The land grid array socket according to claim 1, wherein the metallic reinforcing plate includes first and second metallic reinforcing members, each of the first and second metallic reinforcing members extending between the first end and the second end and being attached along a side of the insulative housing.

6. The land grid array socket according to claim 1, wherein the cover member is pivotally supported by the metallic reinforcing plate.

7. The land grid array socket according to claim 6, wherein the cover member is pivotally supported by a bearing tongue rotatably mounted around an axis of a shaft on which the cover member is mounted.

8. The land grid array socket according to claim 1, wherein the cover member has a concave upper surface for pressing the land grid array package toward the top surface of the insulative housing.

9. The land grid array socket according to claim 8, wherein the upper surface has a larger curvature in an area proximate an opening that accommodates the land grid array package.

10. The land grid array socket according to claim 1, wherein the lever is pivotally supported by the metallic reinforcing plate.

11. The land grid array socket according to claim 1, wherein the metallic reinforcing plate has projections that are received in mounting slots of the insulative housing to mount the metallic reinforcing plate to the insulative housing.

12. The land grid array socket according to claim 11, wherein the projections are heat-pressed into the mounting slots.

13. The land grid array socket according to claim 12, wherein the projections are formed as swaging portions.

14. The land grid array socket according to claim 1, wherein the insulative housing includes an inner housing for receiving the land grid array package and an outer housing for receiving the metallic reinforcing plate.

15. The land grid array socket according to claim 1, wherein the lever is pivotally mounted on the second end of the insulative housing by the metallic reinforcing member.

16. The land grid array socket according to claim 15, wherein the cover member is pivotally mounted on the first end of the insulative housing by the metallic reinforcing member.

17. The land grid array socket according to claim 1, further comprising a heat sink for mounting on an upper surface of the land grid array package.

18. A land grid array socket, comprising:
an insulative housing having a plurality of contacts, the insulative housing having a top surface for receiving a land grid array package that electrically connects to the contacts;
a metallic reinforcing plate positioned on a bottom surface of the insulative housing, the metallic reinforcing plate extending between a first end and a second end of the insulative housing;
a lever pivotally mounted on the metallic reinforcing plate, the lever having a locking portion for locking a cover member against the insulative housing; and
the cover member being pivotally mounted on the top surface of the insulative housing, the cover member being pivotally supported by the metallic reinforcing plate.

19. The land grid array socket according to claim 18, wherein the metallic reinforcing plate is one-piece and extends along a periphery of the insulative housing.

20. The land grid array socket according to claim 18, wherein the metallic reinforcing plate includes first and second metallic reinforcing members, each of the first and second metallic reinforcing members extending between the first end and the second end and being attached along a side of the insulative housing.

21. The land grid array socket according to claim 18, wherein the cover member is pivotally supported by a bearing tongue rotatably mounted around an axis of a shaft on which the cover member is mounted.

22. The land grid array socket according to claim 18, wherein the cover member has a concave upper surface for pressing the land grid array package toward the top surface of the insulative housing.

23. The land grid array socket according to claim 18, wherein the upper surface has a larger curvature in an area proximate an opening that accommodates the land grid array package.

24. The land grid array socket according to claim 23, further comprising a heat sink for mounting on an upper surface of the land grid array package.

25. The land grid array socket according to claim 18, wherein the metallic reinforcing plate has projections that are received in mounting slots of the insulative housing to mount the metallic reinforcing plate to the insulative housing.

26. The land grid array socket according to claim 25, wherein the projections are formed as swaging portions.

27. The land grid array socket according to claim 26, wherein the swaging portions are heat-pressed into the mounting slots.

28. The land grid array socket according to claim 18, wherein the insulative housing includes an inner housing for receiving the land grid array package and an outer housing for receiving the metallic reinforcing plate.

29. The land grid array socket according to claim 18, wherein the cover member is pivotally mounted on the first end of the insulative housing by the metallic reinforcing member.

30. The land grid array socket according to claim 18, wherein the metallic reinforcing plate includes an interlocking portion integrally formed with the metallic reinforcing plate to lock the lever.

31. The land grid array socket according to claim 30, wherein the lever includes a rotatably-supported portion which is rotatably supported by the metallic reinforcing plate, an actuating portion bent at a predetermined angle away from the rotatably-supported portion, and a shaft extending from the rotatably supported portion to the actuating portion, the actuating portion having a length which is sufficient to allow displacement of the shaft when the actuating portion is disengaged from the interlocking protrusion.

32. The land grid array socket according to claim 31, wherein the metallic reinforcing member has space for accommodating the shaft when the shaft is displaced.

33. The land grid array socket according to claim 32, wherein the actuating portion forms an obtuse angle with the shaft.

34. The land grid array socket according to claim 33, wherein the actuating portion forms a right angle with the rotatably-supported portion.

35. A land grid array socket, comprising:
an insulative housing having a plurality of contacts, the insulative housing having a top surface for receiving a land grid array package;
a metallic reinforcing plate mounted on a bottom surface of the insulative housing;
a cover member pivotally mounted on a first end of the metallic reinforcing plate, the cover member being pivotal between an open position and a closed position where the cover member presses the land grid array package toward the top surface of the insulative housing so that land grid array package electrically connects to the contacts; and
a lever pivotally mounted on a second end of the metallic reinforcing plate, the lever having a locking portion for locking the cover member in the closed position.

36. The land grid array socket according to claim 35, wherein the reinforcing plate includes an interlocking portion integrally formed with the metallic reinforcing plate that locks the lever.

37. The land grid array socket according to claim 35, wherein the metallic reinforcing plate is one-piece and extends along a periphery of the insulative housing.

38. The land grid array socket according to claim 35, wherein the metallic reinforcing plate includes first and second rotary shafts that engage with first and second shaft-engaging portions of the cover member to pivotally mount the cover member to the metallic reinforcing plate.

39. The land grid array socket according to claim 35, wherein the cover member has a concave upper surface for pressing the land grid array package toward the top surface of the insulative housing.

40. The land grid array socket according to claim 39, wherein the concave upper surface has a larger curvature in an area proximate an opening that accommodates the land grid array package.

41. The land grid array socket according to claim 35, wherein the metallic reinforcing plate has notches that engage with swaging portions of the insulative housing to mount the metallic reinforcing plate to the insulative housing.

42. The land grid array socket according to claim 41, wherein the swaging portions are integrally molded with the housing.

43. The land grid array socket according to claim 42, wherein the swaging portions are heat-pressed to fix the insulative housing to the metallic reinforcing plate.

44. A land grid array socket, comprising:
 an insulative housing having a plurality of contacts, the insulative housing having a top surface for receiving a land grid array package that electrically connects to the contacts;
 a metallic reinforcing plate mounted on a bottom surface of the insulative housing, the metallic reinforcing plate extending between a first end and a second end of the insulative housing;
 a cover member pivotally mounted on the metallic reinforcing plate; and
 a lever pivotally mounted on the metallic reinforcing plate, the lever having a locking portion for locking the cover member against the insulative housing.

45. The land grid array socket according to claim 44, wherein the metallic reinforcing plate is one-piece and extends along a periphery of the insulative housing.

46. The land grid array socket according to claim 44, wherein the cover member has a concave upper surface for pressing the land grid array package toward the top surface of the insulative housing.

47. The land grid array socket according to claim 46, wherein the concave upper surface has a larger curvature in an area proximate an opening that accommodates the land grid array package.

48. The land grid array socket according to claim 44, wherein the metallic reinforcing plate includes an interlocking portion integrally formed with the metallic reinforcing plate that locks the lever.

49. The land grid array socket according to claim 44, wherein the cover member is mounted on a first end of the metallic reinforcing plate and the lever is mounted on a second end of the metallic reinforcing plate.

50. The land grid array socket according to claim 44, wherein the metallic reinforcing plate has notches that engage with swaging portions of the insulative housing to mount the metallic reinforcing plate to the insulative housing.

51. The land grid array socket according to claim 50, wherein the swaging portions are integrally molded with the housing.

52. The land grid array socket according to claim 51, wherein the swaging portions are heat-pressed to fix the insulative housing to the metallic reinforcing plate.

53. The land grid array socket according to claim 44, wherein the metallic reinforcing plate includes first and second rotary shafts that engage with first and second shaft-engaging portions of the cover member to pivotally mount the cover member to the metallic reinforcing plate.

* * * * *

UNITED STATES PATENT AND TRADEMARK OFFICE
CERTIFICATE OF CORRECTION

PATENT NO. : 7,001,197 B2
DATED : February 21, 2006
INVENTOR(S) : Hiroshi Shirai, Masashi Inoue and Shinichi Hashimoto It is certified that error appears in the above-identified patent and that said Letters Patent is hereby corrected as shown below:

Column 14,
Line 65, "the upper surface" should be -- the concave upper surface --.

Column 15,
Lines 20 and 24, "metallic reinforcing member" should be -- metallic reinforcing plate --.
Line 62, "the upper surface" should be -- the concave upper surface --.

Column 16,
Lines 18 and 34, "metallic reinforcing member" should be -- metallic reinforcing plate --.
Line 31, "interlocking protrusion" should be -- interlocking portion --.
Line 53, "insulative housing so the land" should be -- insulative housing so that the land --.
Line 59, "the reinforcing plate" should be -- the metallic reinforcing plate --.

Signed and Sealed this

Twenty-third Day of May, 2006

JON W. DUDAS
*Director of the United States Patent and Trademark Office*